(12) United States Patent
Kaul et al.

(10) Patent No.: US 10,642,614 B2
(45) Date of Patent: May 5, 2020

(54) RECONFIGURABLE MULTI-PRECISION INTEGER DOT-PRODUCT HARDWARE ACCELERATOR FOR MACHINE-LEARNING APPLICATIONS

(71) Applicant: Intel Corporation, Santa Clara, CA (US)

(72) Inventors: Himanshu Kaul, Portland, OR (US); Mark Anders, Hillsboro, OR (US); Seongjong Kim, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 46 days.

(21) Appl. No.: 16/147,691

(22) Filed: Sep. 29, 2018

(65) Prior Publication Data

US 2019/0042252 A1   Feb. 7, 2019

(51) Int. Cl.
*G06F 9/30* (2018.01)
*G06F 15/80* (2006.01)
(Continued)

(52) U.S. Cl.
CPC ........ *G06F 9/30036* (2013.01); *G06F 7/5443* (2013.01); *G06F 9/3001* (2013.01); *G06F 9/3885* (2013.01); *G06F 15/8053* (2013.01); *G06F 17/15* (2013.01); *G06F 17/16* (2013.01); *G06F 30/39* (2020.01); *G06N 3/0454* (2013.01); *G06N 3/063* (2013.01); *H03K 19/21* (2013.01); *G06F 7/501* (2013.01); *G06F 2207/382* (2013.01)

(58) Field of Classification Search
CPC ....... G06F 15/80–8015; G06F 15/8053; G06F 17/15; G06F 17/16; G06F 9/30036; G06F 9/3885
See application file for complete search history.

(56) References Cited

U.S. PATENT DOCUMENTS 6,144,980 A * 11/2000 Oberman .................. G06F 7/53
708/627
7,072,929 B2 * 7/2006 Pechanek .............. G06F 7/4812
708/622

(Continued)

OTHER PUBLICATIONS

Kuang, S., Liang, C. & Chang, M., "A Multi-functional Multi-precision 4D Dot Product Unit with SIMD Architecture", Arab J Sci Eng 41, pp. 3139-3151, 2016 (Year: 2016).*

*Primary Examiner* — Matthew D Sandifer
(74) *Attorney, Agent, or Firm* — Nicholson De Vos Webster & Elliott LLP

(57) ABSTRACT

A configurable integrated circuit to compute vector dot products between a first N-bit vector and a second N-bit vector in a plurality of precision modes. An embodiment includes M slices, each of which calculates the vector dot products between a corresponding segment of the first and the second N-bit vectors. Each of the slices outputs intermediary multiplier results for the lower precision modes, but not for highest precision mode. A plurality of adder trees to sum up the plurality of intermediate multiplier results, with each adder tree producing a respective adder out result. An accumulator to merge the adder out result from a first adder tree with the adder out result from a second adder tree to produce the vector dot product of the first and the second N-bit vector in the highest precision mode.

20 Claims, 18 Drawing Sheets

(51) Int. Cl.
*G06F 17/16* (2006.01)
*G06F 17/15* (2006.01)
*G06F 9/38* (2018.01)
*H03K 19/21* (2006.01)
*G06N 3/063* (2006.01)
*G06F 7/544* (2006.01)
*G06N 3/04* (2006.01)
*G06F 30/39* (2020.01)
*G06F 7/501* (2006.01)

(56) References Cited

U.S. PATENT DOCUMENTS

| | | | | |
|---|---|---|---|---|
| 2008/0071851 | A1* | 3/2008 | Zohar | G06F 7/5443 |
| | | | | 708/626 |
| 2008/0114826 | A1* | 5/2008 | Mejdrich | G06F 17/16 |
| | | | | 708/523 |
| 2009/0049113 | A1* | 2/2009 | Muff | G06F 7/5443 |
| | | | | 708/524 |
| 2009/0158013 | A1* | 6/2009 | Muff | G06F 9/30036 |
| | | | | 712/222 |
| 2010/0023568 | A1* | 1/2010 | Hickey | G06F 7/483 |
| | | | | 708/209 |
| 2014/0164465 | A1* | 6/2014 | Muff | G06F 7/483 |
| | | | | 708/501 |
| 2019/0325296 | A1* | 10/2019 | Fowers | G06F 15/8053 |

\* cited by examiner 400 (CONTINUED)

RECONFIGURABLE MULTI-PRECISION INTEGER DOT-PRODUCT HARDWARE ACCELERATOR FOR MACHINE-LEARNING APPLICATIONS

TECHNICAL FIELD

Embodiments of the invention described herein relate generally to the hardware accelerator architecture in a computer processing system. In particular, the disclosure relates to optimizations for a reconfigurable multi-precision integer dot-product hardware accelerator for machine-learning applications.

BACKGROUND ART

The power and performance of machine-learning and deep neural network algorithms is dictated by the matrix multiply kernel. Specialized hardware typically implement multiply-adder trees to increase energy efficiency of the underlying dot-product operations that are involved in matrix multiplication. In order to support the numerous different training and inference workloads, a dot-product circuit needs to support different precisions with maximum area and energy efficiency for each precision. These can vary from 16-bit/32-bit support for some architectures while 1-bit to 8-bit on others. Support for multiple-precision dot-products, however, tend to negatively affect the area and energy efficiencies of the underlying dot product circuit.

BRIEF DESCRIPTION OF THE DRAWINGS

The invention may best be understood by referring to the following description and accompanying drawings that are used to illustrate embodiments of the invention. In the drawings.

DETAILED DESCRIPTION

Embodiments of system, method, and processor for data prefetching optimization based on non-uniform memory access characteristics are described herein. In the following description, numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. For clarity, individual components in the figures herein may be referred to by their labels in the figures, rather than by a particular reference number.

To compute a dot product of a specific precision, conventional multi-precision dot product circuits typically compute individual precision-dependent multiplier products and then summing them using an adder tree. The multiply units within the circuits build larger precision products from smaller multipliers. Unfortunately, the reconfiguration overhead associated using smaller multipliers to build larger precision products is typically replicated across all of the multipliers in the system. In addition, the multiplexer logic that is used to select the correct product for each precision mode is also replicated after every multiplier. As for the adder tree, it is usually sized to accommodate the bit-width of the largest product, even though a narrower product may be computed. Collectively, these design choices contribute to significant area and energy overhead for the dot product circuit.

Aspects of the present invention intend to address these inefficiencies by removing the precision-dependent multiplexers and reconfiguration logic from the multipliers and placing them after or later down in the adder tree. This leverages the idea that it is more important to reach the final dot product at the end, rather than making available any of the intermediate individual products. By not explicitly completing the calculations on each of the individual multiplier products, which results in fewer overall multiplexers and narrow adder tree width, aspects of the present invention help lower the area and power required for the completed dot product.

Figure 1:
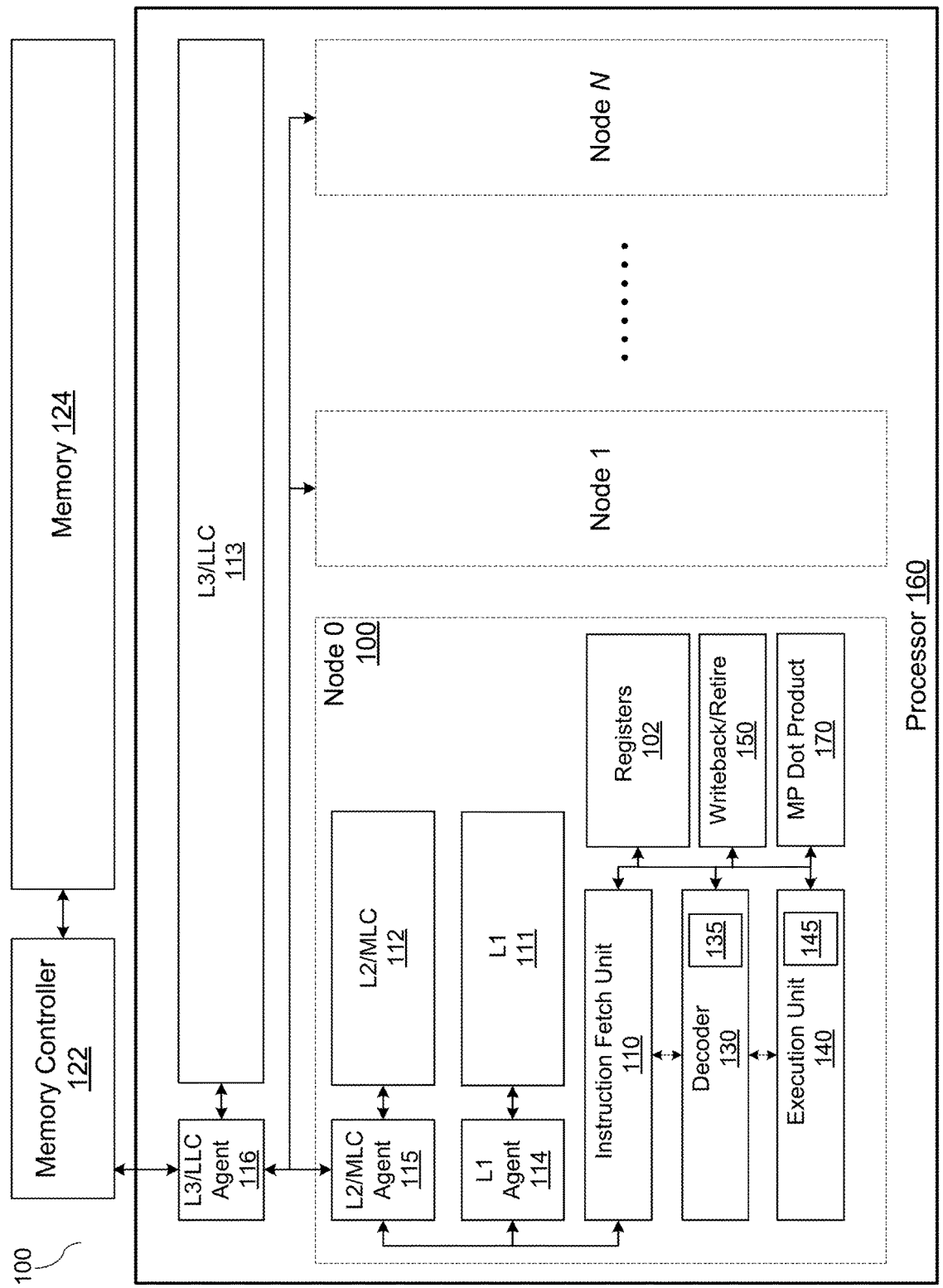
FIG. 1 is a block diagram illustrating an exemplary system on which embodiments of the present invention may be implemented.

FIG. 1 illustrates an exemplary system on which embodiments of the present invention may be implemented. System 100 includes processor 160 that is communicatively coupled to memory 124. Processor 160 may be a chip multi-processor (CMP) that includes one or more nodes. Each of the nodes may constitute or include: a processor core (core), a logical processor, or a hardware thread. The details of a single node (i.e., node 0) are illustrated in FIG. 1 for simplicity. It will be understood, however, that each of the other nodes may have the same set of logic, components, circuitry, and/or configuration as node 0. For example, each node may include a set of registers 102, a level 1 cache (L1) 111, and a L2 (L2) or mid-level cache (MLC) 112. In some embodiments, processor 160 may further includes a level 3 (L3) cache or LLC 113 that is communicatively coupled to, and shared by, all the nodes. In other embodiments (not shown), the L3/LLC 113 is physically distributed and logically shared among the nodes. Each of L1, L2/MLC, and L3/LLC caches, according to an embodiment, is managed by a respective cache agent or controller (114-116) and usable for caching instructions and data according to a specified cache management policy. One or more cache agents or controllers may be used to perform the functions of a home agent, which may utilize directories to ensure and enforce cache coherence. In at least some embodiments, the cache management policy further includes a cache eviction/replacement policy. The instructions and data stored within the various processor caches are managed at the granularity of cache lines which may be a fixed size (e.g., 64, 128, 512 Bytes in length). Each node of the exemplary embodiments further includes an instruction fetch unit 110 for fetching instructions from main memory 124 via memory controller 122 and/or from the shared LLC 113 via L3/LLC agent 116; a decoder 130 for decoding the instructions (e.g., decoding program instructions into micro-operations or "uops"); an execution unit 140 for executing the decoded instructions; and a writeback unit 150 for retiring the instructions and writing back the results (e.g., to main memory 124). Furthermore, decoder 130 may include specific logic or circuitry to decode dot product instructions. Similarly, the execution unit may also include specific logic or circuitry (i.e., multi-precision dot product circuitry) to execute the decoded dot product instructions by performing various operations. The dot product instruction may include one or more operand. The operands may specify one or more memory addresses from which data is to be read. The operands may also indicate the precision mode in which the dot product is to be calculated. According to an embodiment, processor 160 may include one or more dedicated multi-precision dot product accelerators 170 to perform dot product operations.

Figure 2A:
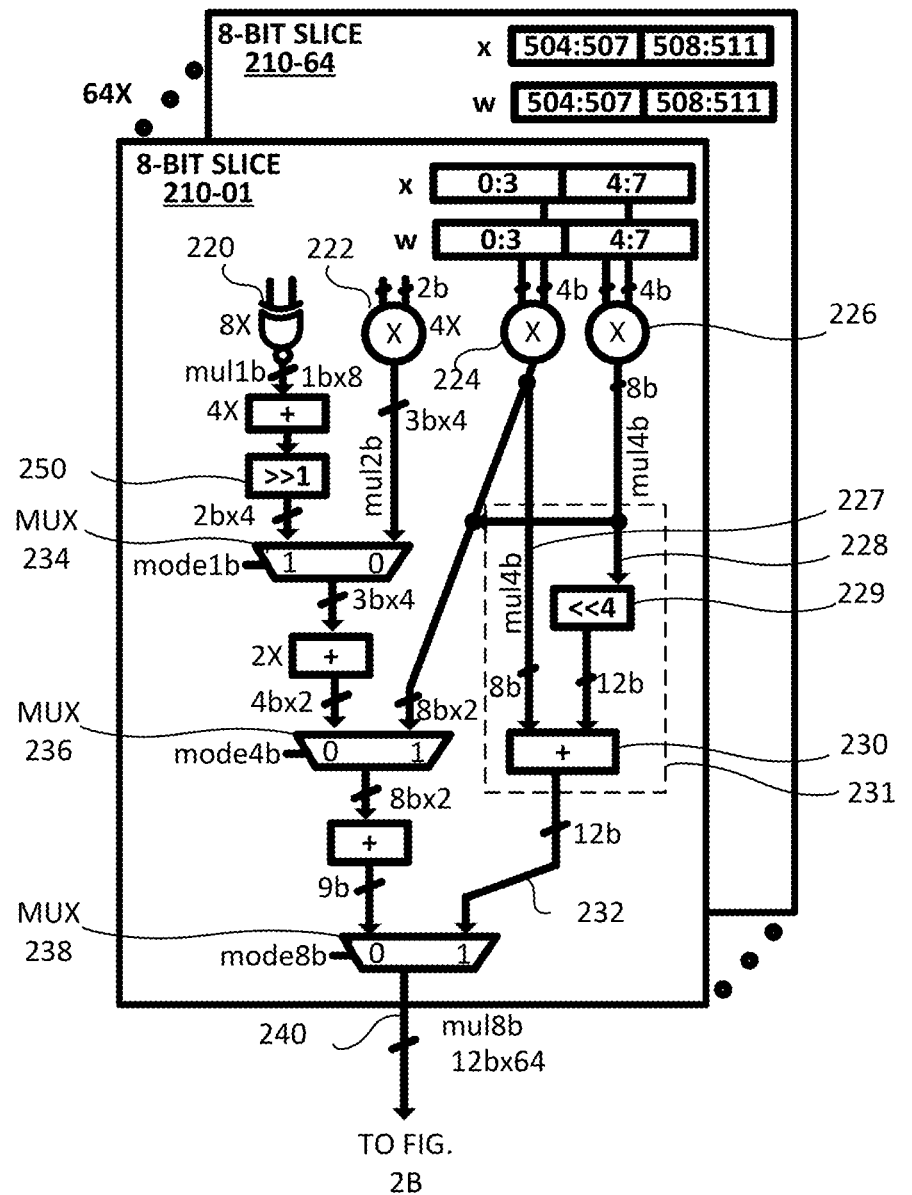
FIGS. 2A-2B illustrate an example of a conventional 512-bit multi-precision dot product circuit.
Figure 2B:
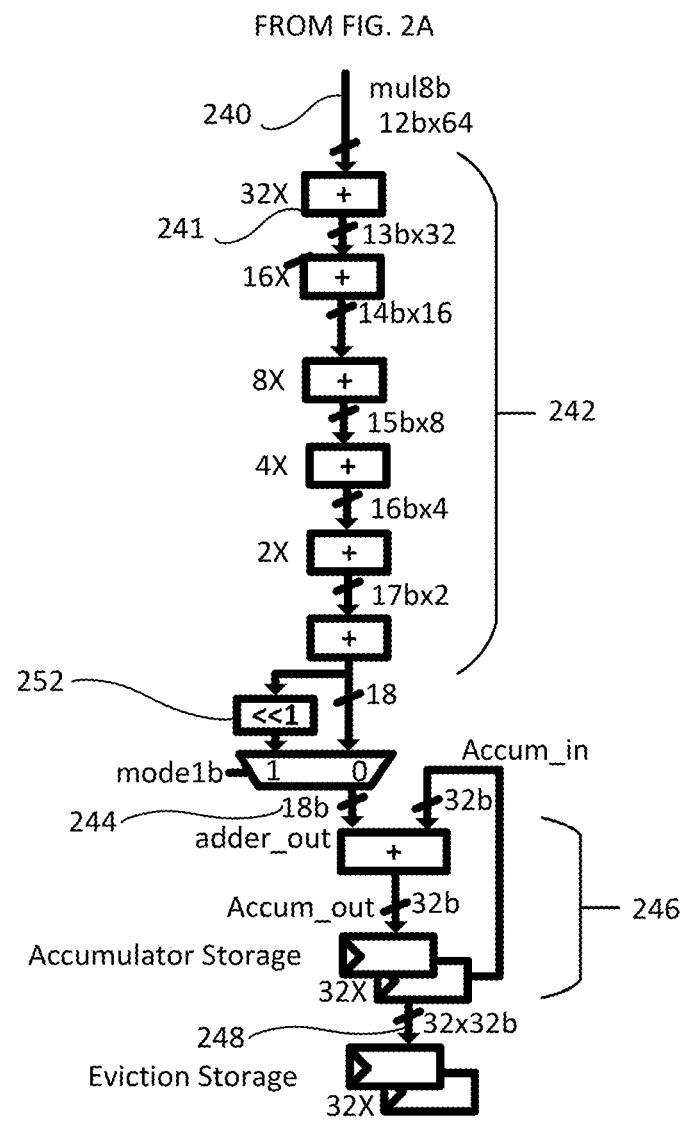

FIGS. 2A-2B illustrate an example of a conventional 512-bit multi-precision dot product circuit 200 according to an embodiment. Dot product circuit 200 can be configured to compute a 512-element 1-bit dot product ($\Sigma_{512}x_i \cdot w_i$), 256-element 2-bit dot product ($\Sigma_{256}x_i[1:0] \cdot w_i[1:0]$), 128-element 4-bit dot product ($\Sigma_{128}x_i[3:0] \cdot w_i[3:0]$), or 64-element 8-bit dot product ($\Sigma_{64}x_i[7:0] \cdot w_i[4:0]$). The x and w represent activation and weight inputs, respectively. In this particular example, the maximum precision for x is 8 bits and for w is 4 bits. Thus, in the case of 64-element 8-bit dot product, the highest precision for the result is 12 bits. The precision referred to herein is the bit size of the vector elements.

As shown in FIG. 2A, the 512-bit dot product circuit 200 features 64 instantiations of an 8-bit slice module 210-01~210-64. Each of the slices performs the dot product calculations for a corresponding 8-bit segment in a given precision modes. Specifically, each of the 64 slice modules contains eight exclusive NOR (XNOR) gates 220, four 2-bit multipliers 222, and two 4-bit multipliers 224, 226 to support the required throughput for 1-bit, 2-bit, and 4-bit precision modes. For the 8-bit precision mode, adjacent 4 bits of w in each 8-bit slice are sent in as identical inputs to the two 4-bit multipliers 224 and 226, such that w[3:0]=w[7:4]. The multiplier result 228 from the 4-bit multiplier 226 is then shifted left by four bits via shifter 229 before being merged with the multiplier result 227 from the 4-bit multiplier 224 using adder 230 to produce the final 12-bit result 232 for the 8-bit precision mode. Multiplexers (MUX) 234, 236, and 238 are used to select between the higher-precision dot product and the lower-precision dot product based on the selected mode (e.g., 1/2/4/8-bit modes). For instance, multiplexer 234 is used to select the results from the 8 XNORs, if 1-bit mode is used, and to select the results from the four 2-bit multipliers, if 2-bit mode is used. Multiplexer 236 is used to select the results from the 4-bit multiplier if 4-bit mode is used and multiplexer 238 is used to select the merged result from the two 4-bit multipliers if 8-bit mode is used. The final 12-bit output mul8b 240 of 8-bit slice represents one of the 8b×4b, $\Sigma_2$4b×4b, $\Sigma_4$2b×2b or $\Sigma_8$1b×1b results. It is important to know that, the dot product calculation for a corresponding 8-bit segment is complete by the end of the slice.

The dot product circuit 200 continues in FIG. 2B, where an adder tree 242, which includes multiple adders, compresses the 12-bit result 240 from each of the 64 slices to produce an 18-bit result (adder_out) 244. Thereafter, the 18-bit adder_out 244 may be accumulated by an accumulator 246 into a 32-bit result 248 for larger dot-products. It's helpful to note that the outputs of the 2-bit multiply are limited in range, requiring only a 3-bit output from the 2-bit multiplier. Moreover, since the result of the 2-element 1-bit dot products $\Sigma_2$1b×1b are limited to {−2,0,−2}, their range may be compressed, by using a right shift 250 (FIG. 2A) before the adder tree along with a 1-bit left-shift 252 at the end of the adder tree, without impacting final result.

Figure 3A:
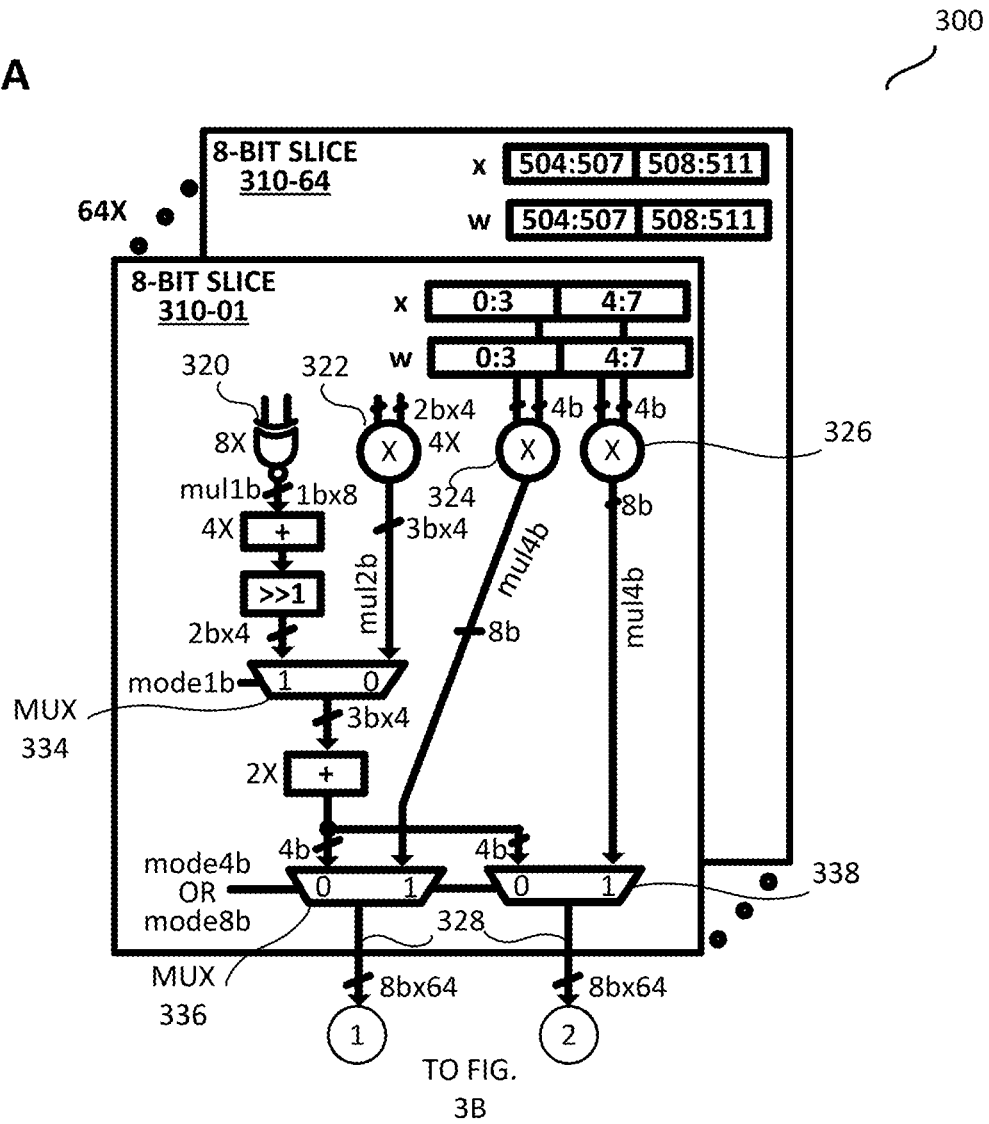
FIGS. 3A-3B illustrate a 512-bit multi-precision dot product circuit according an embodiment of the present invention.
Figure 3B:
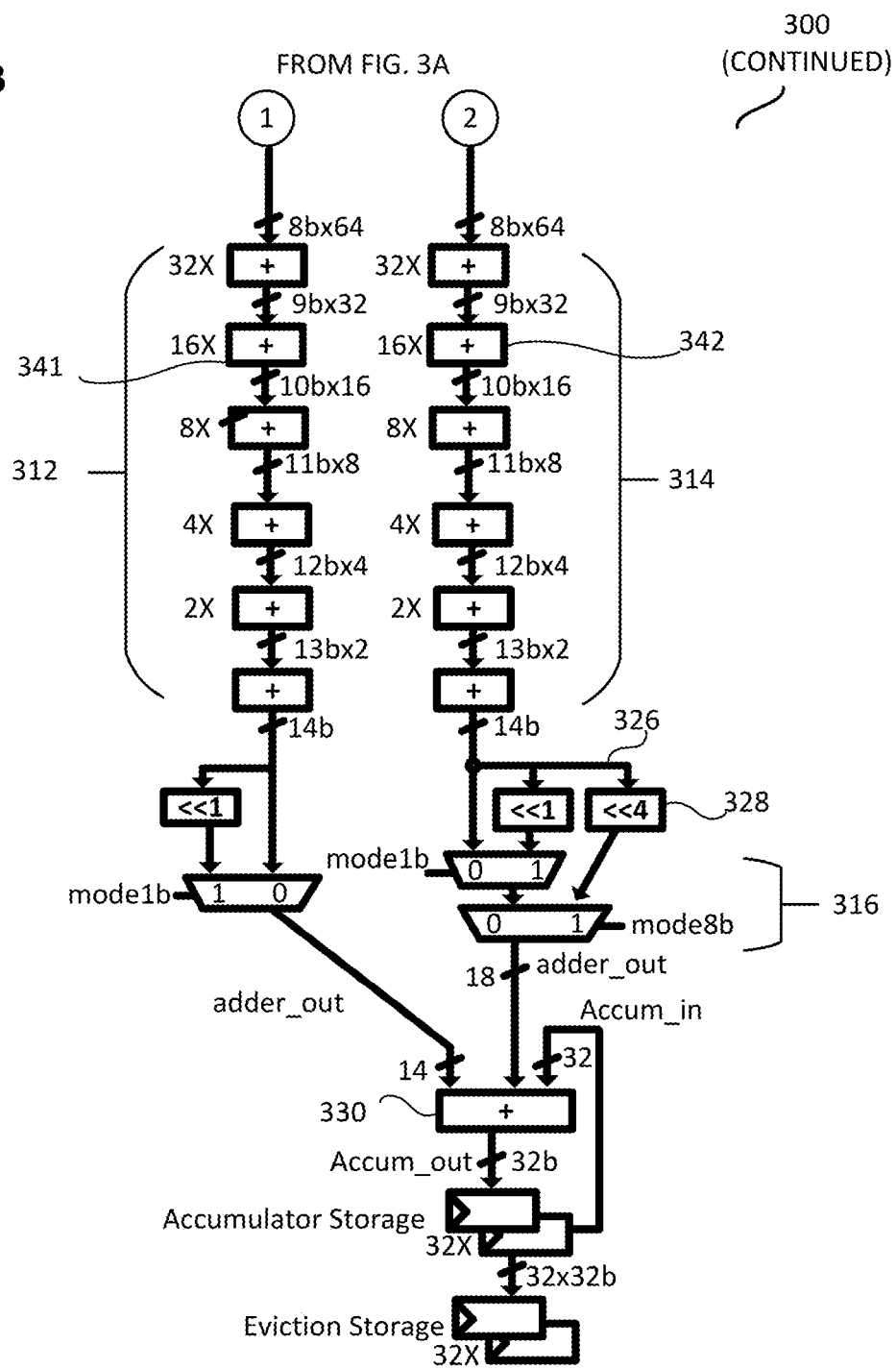

FIGS. 3A-3B show a multi-precision 512-bit dot product circuit 300 in accordance to an embodiment. While 512-bit dot product circuits are used herein and throughout the application, it should be appreciated that the optimizations and techniques described in this application may be applied to circuits of any size and precision modes.

In FIG. 3A, the optimized dot product circuit 300, similar to the dot product circuit 200 of FIG. 2A, features eight XNOR gates 320, four 2-bit multipliers 322, and two 4-bit multipliers 324, 326 to support the required throughput for 1-bit, 2-bit, and 4-bit precision modes. Multiplexers 334 and 336 are used to select the results for these precision modes.

For the 8-bit precision mode, however, the multi-precision merge logic (e.g., 231 of FIG. 2A) in each of the 8-bit slice modules 310-1~310-64 is relocated from within the 8-bit slice to the end of the adder tree. Specifically, in contrast with the conventional dot product circuit 200, instead of summing the results at the outputs of MUX 236, corresponding even/odd results 328 from each of the 8-bit slices 310-1~310-64 are summed in separate trees 312 and 314 and merged at the end of the adder trees. In 1/2/4-bit precision modes, the ordering of these summations does not affect the result. For 8-bit precision mode, the summation of the partial results 326 from adder tree 314 that are associated with higher significance are shifted left by 4 bits (via shifter 328) and then summed with the result of adder tree 312 in adder 330. This is the equivalent to changing from $\Sigma_{64}((w[7:4]*x[7:4])<<4)+(w[3:0]*x[3:0]))$ to $(\Sigma_{64}(w[7:4]*x[7:4]))<<4+(\Sigma_{64}(w[3:0]*x[3:0]))$.

As a result of this optimization, 64 8-bit adders and 64 12-bit multiplexers (MUX 328) are removed from the optimized dot product circuit 300 when compared to the conventional dot product circuit 200. In addition, the adder tree bit-width is also reduced by 3 bits. For instance, consider adder 241 of FIG. 2B and adders 341 and 342 of FIG. 3B. Instead of taking in 12-bit-wide inputs as is the case for adder 241, each of the adders 341 and 342 now takes in inputs that are only 9-bits wide. Narrower inputs translate to savings in the area required. The optimizations made to dot product circuit 300 requires only a single 18-bit 3-to-1 multiplexer combination 316 to be added at the end of the adder tree.

Figure 4A:
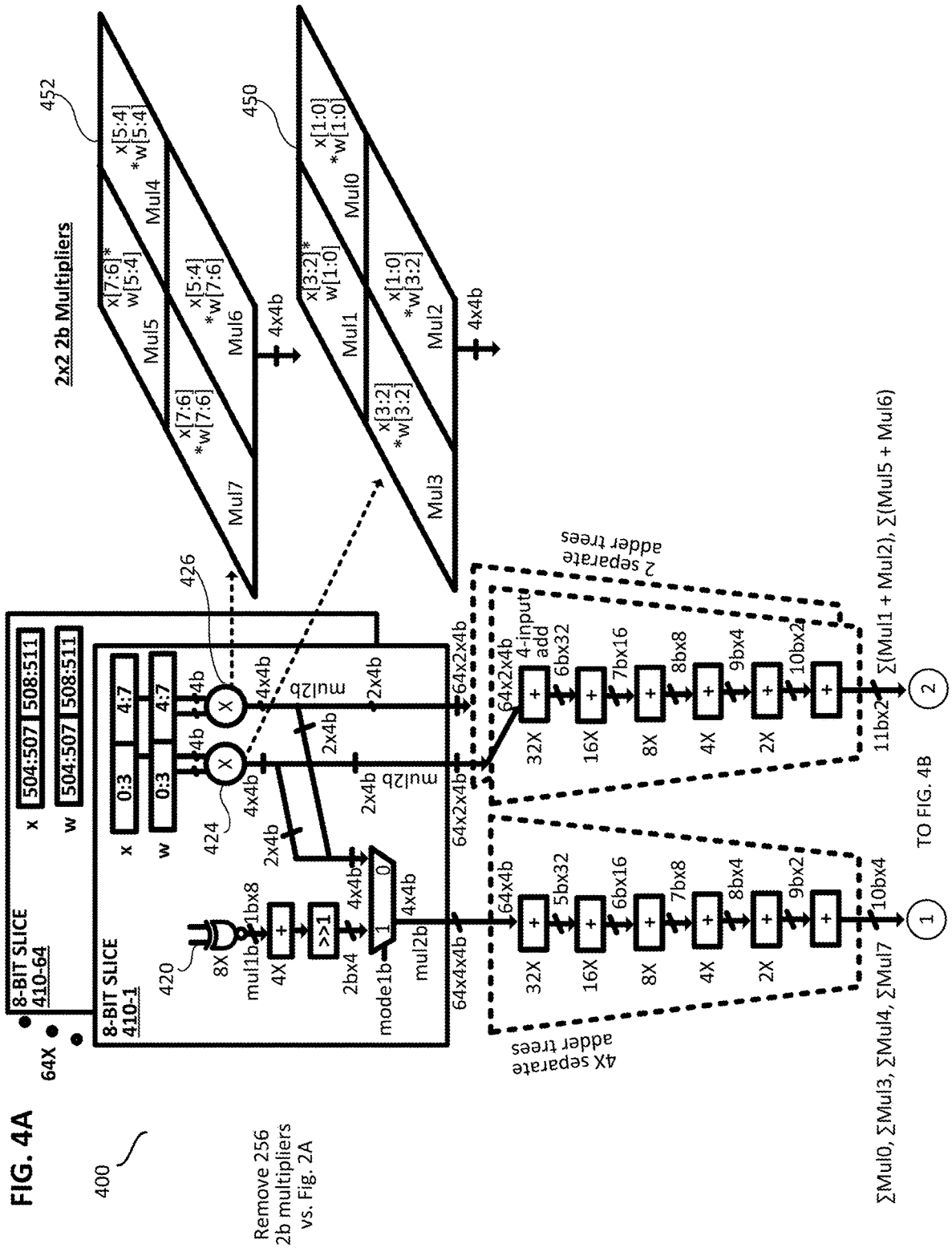
FIGS. 4A-4B illustrate another 512-bit multi-precision dot product circuit according an embodiment of the present invention.
Figure 4B:
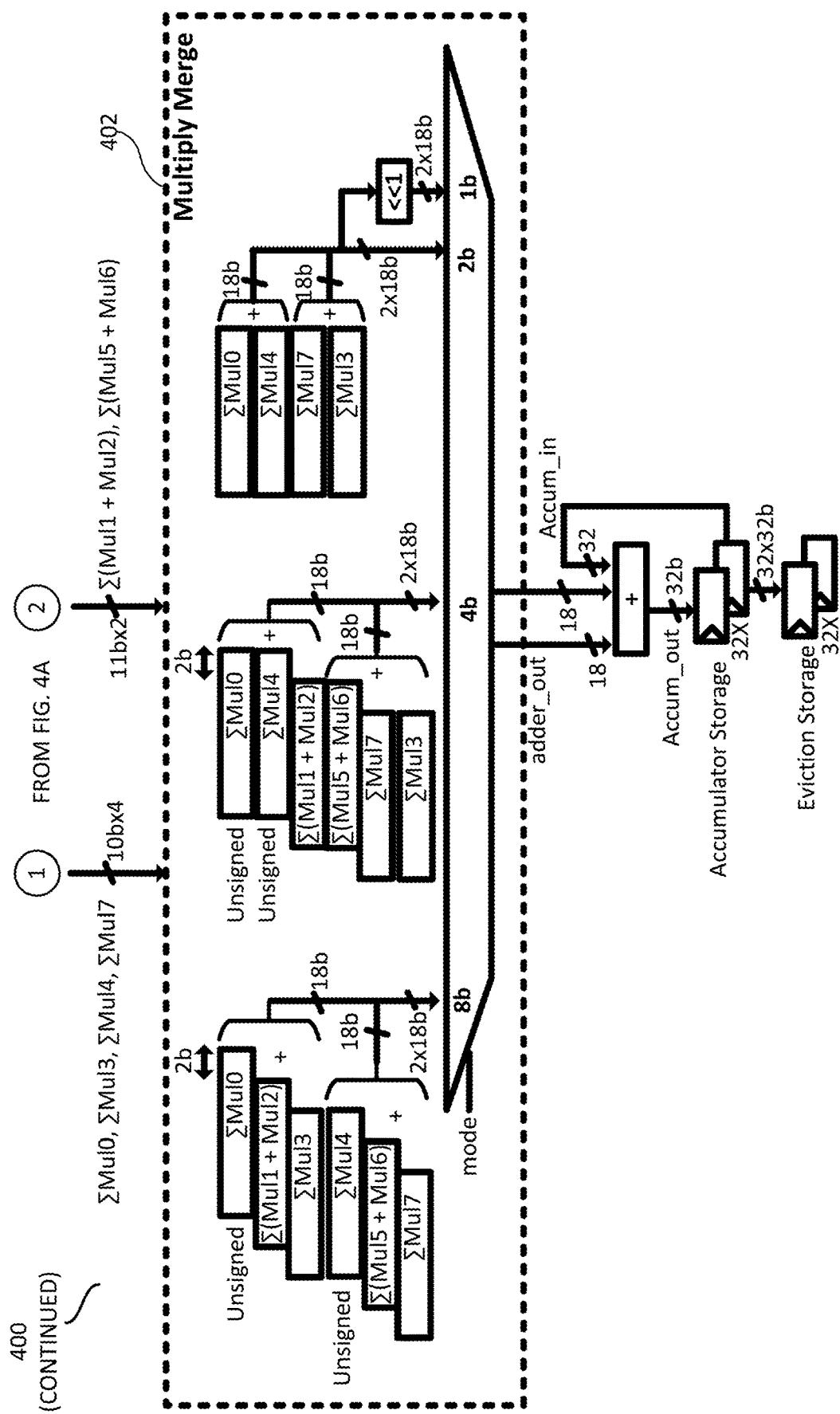

FIGS. 4A-4B illustrate another embodiment of the present invention in which all 2-bit/4-bit/8-bit precision dot products are built from 2-bit multiply-adder trees. In particular, in dot product circuit 400, each of the two 4-bit multipliers (e.g., 424 and 426) is replaced by four 2-bit multipliers. For example, the 4-bit multiplier 424 is replaced by four 2-bit multipliers Mul0-Mul3, collectively shown as 450. Similarly, the 4-bit multiplier 426 is replaced by four 2-bit multipliers Mul4-Mul7, shown as 452. Each of the 2-bit multipliers Mul0-Mul7 functions as one of quadrants required to build a larger 4-bit multiply result. Note that multipliers Mul0 and Mul4 correspond to a first quadrant, Mul1 and Mul5 correspond to a second quadrant, Mul2 and Mul6 correspond to a third quadrant, and Mul3 and Mul7 correspond to a fourth quadrant. The merge operation of the different quadrants is not performed within the 8-bit slice but rather delayed till the end of the adder tree. The multiply merge 402 shows the merge operation. Specifically, Mul0, Mul3, Mul4, and Mul7 are reused for 2-bit precision mode, replacing 256 2-bit multipliers from the conventional dot product circuit 200. These multiplier quadrants (Mul0, Mul3, Mul4, and Mul7) from each 8-bit slice are summed with separate adder trees. On the other hand, since Mul1, Mul2, Mul5 and Mul6 are required only for 4-bit/8-bit modes and are summed at the same significance, they can be added to the same adder tree. According to the embodiment, this optimization results in a total of 6 separate and smaller adder trees. The outputs of these adder trees are merged using a single multiply merge circuit 402 to produce the final dot product for the different precisions. It's worth noting that not all 6 of the separate adder trees need to be active at the same time. In lower precision modes, only the results from a subset of the adder trees may be needed to generate the final dot product. In those cases, one or more adder trees may be disabled or deactivated to conserve power. When compared with dot product circuit 300, dot product circuit 400 provides additional area and energy savings by removing multiplexers 336 and 338 from each of the 8-bit slices. When compared with dot product circuit 200, multiplexers 236 and 238, as well as the multi-precision merge logic 231, are removed from each of the 8-bit slices.

By moving the 8-bit dot-product merge logic from the slices to the end of the adder tree, embodiments, such as the dot product circuit 300 of FIG. 3, have demonstrated a reduction in total area required by as much as 20% over conventional designs (e.g., circuit 200). Furthermore, embodiments that reuse circuits, such as dot product circuit 400 which uses only 2-bit multiplier-adder trees to build the dot product for various higher precision modes, can further reduce the area required by as much as 34% when compared to conventional designs. In terms of combinational logic area, the savings achieved by these embodiments are even greater, at 30% and 49%, respectively.

Figure 5:
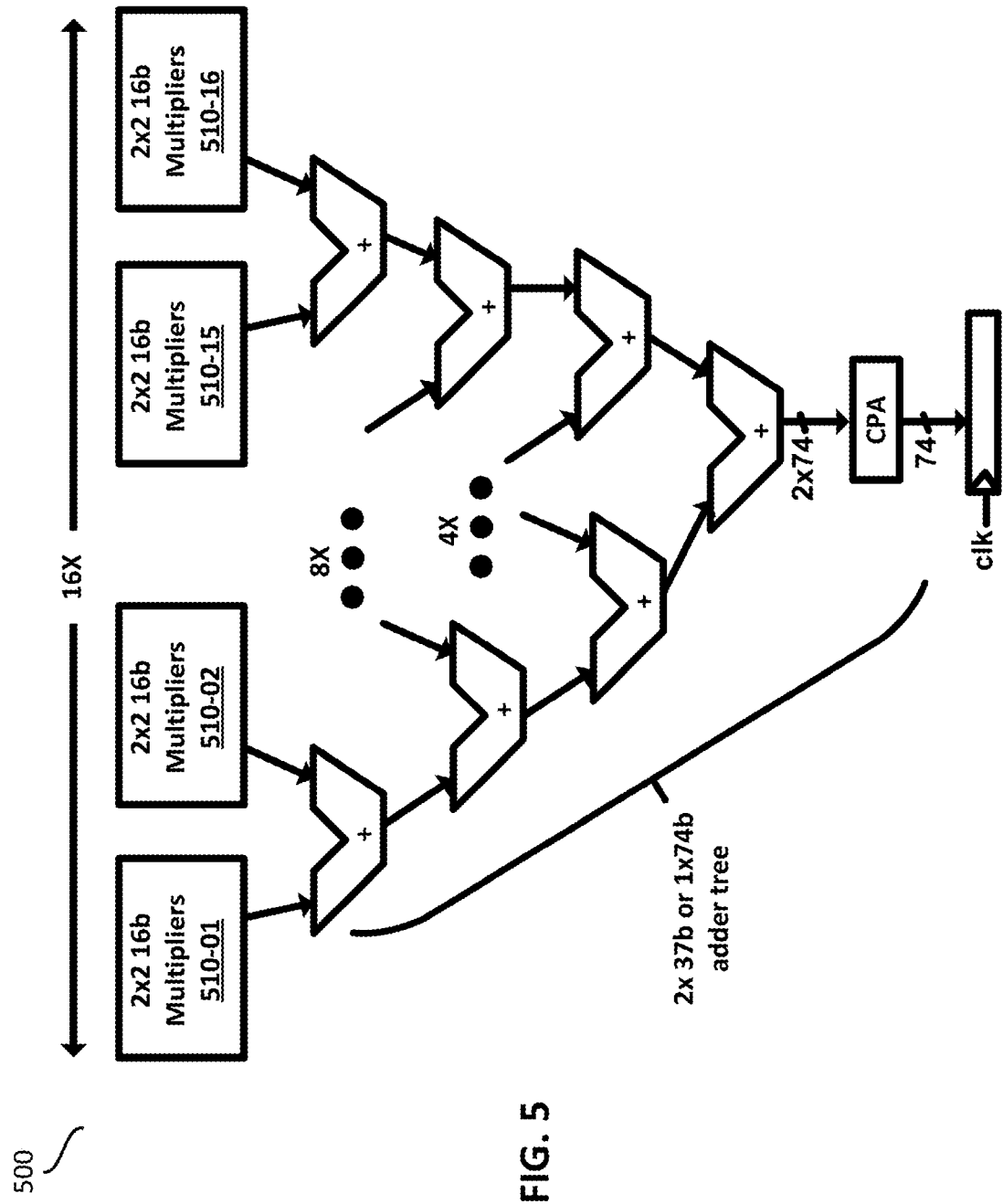
FIG. 5 illustrates an example of a conventional multiply adder tree.

The optimizations and techniques described above also yield similar area and energy benefits for multiply-adder tree designs with larger precisions. FIG. 5 shows a conventional multiply adder tree 500, according to an embodiment, that can be configured to operate in either 4×16-bit mode or 1× 32-bit mode. In 16-bit mode, multiply adder tree 500 computes 2 separate 32-element 16-bit dot-products $(2 \times \Sigma_{32}\text{Mul}16)$. In 32-bit mode, a single 16-element 32-bit dot-product $(1 \times \Sigma_{16}\text{Mul}32)$ is computed. Multiply adder tree 500 includes 16 multiplier building blocks 510.

Figure 6:
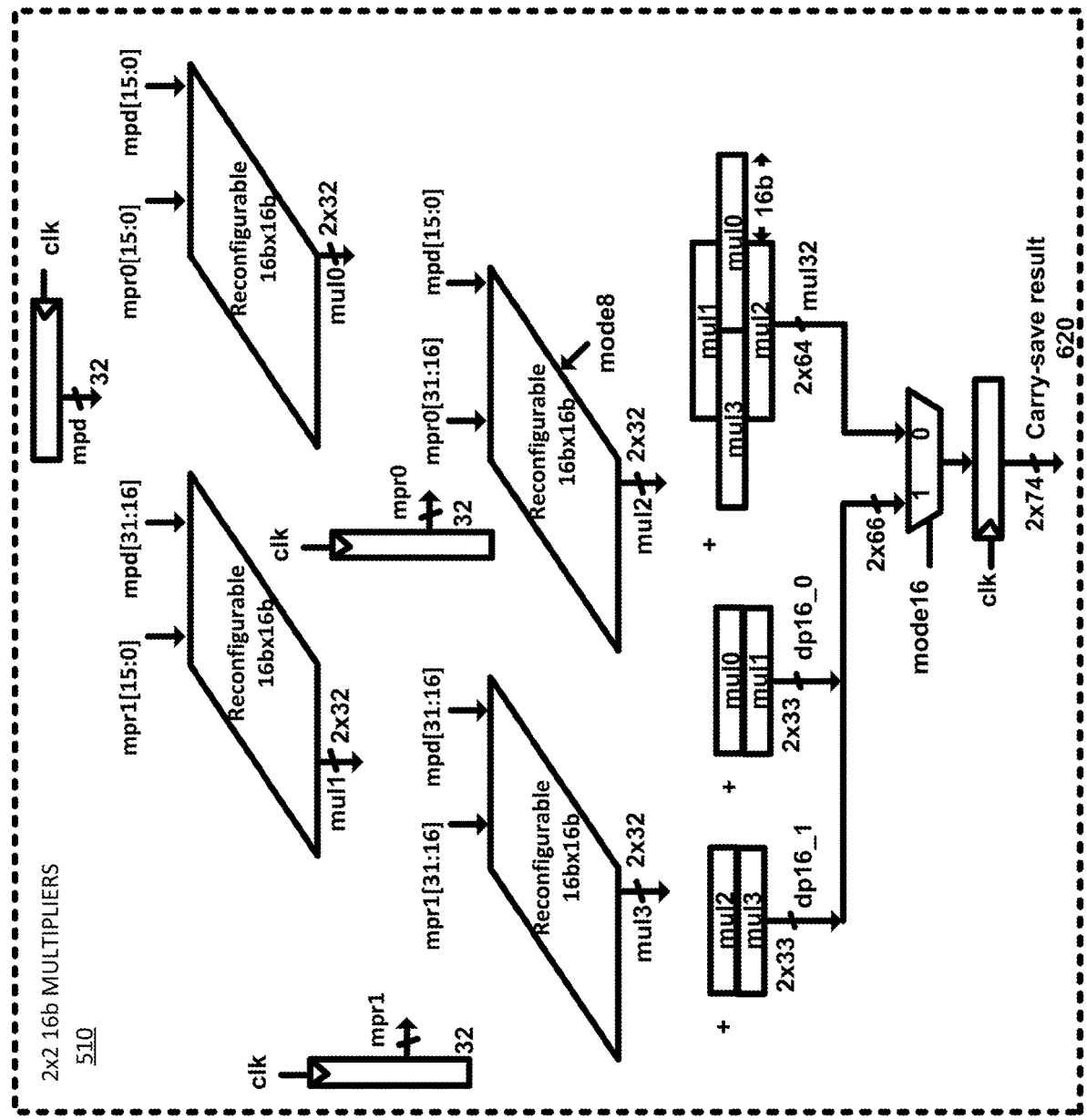
FIG. 6 illustrates the details an exemplary multiplier building block.

The details of multiplier building block 510 is illustrated in FIG. 6. Each of the multiplier building blocks 510 consists of a 2×2 arrangement of four 16-bit multipliers mul0-mul3. In 16-bit mode, each pair of the multipliers is summed to produce a respective dot product. The sum of multipliers mul2 and mul3 produces dot product dp16_1. The sum of multipliers mul0 and mul1 produces dot product dp16_0. In 32-bit mode, each of the 16-bit multipliers mul0-mul3 operates as one of four quadrants of a larger 32-bit multiplier. Their outputs are summed with the correct significance (e.g., via shifters) to produce the 64-bit result of the 32-bit multiplier. The carry-save result 620 outputted by the multiplier building block 510, either the packed lower-precision results in 16-bit mode or the single 32-bit multiply result, is then sent to a reconfigurable adder tree (e.g., 500) with precision-dependent carry kills to produce a 2-way 37-bit dot-products for the 16-bit mode or a single 74b dot-product for the 32-bit mode. In some embodiments, a final carry-propagation adder (CPA) converts the accumulated carry-save results into 2's complement format.

Figure 7:
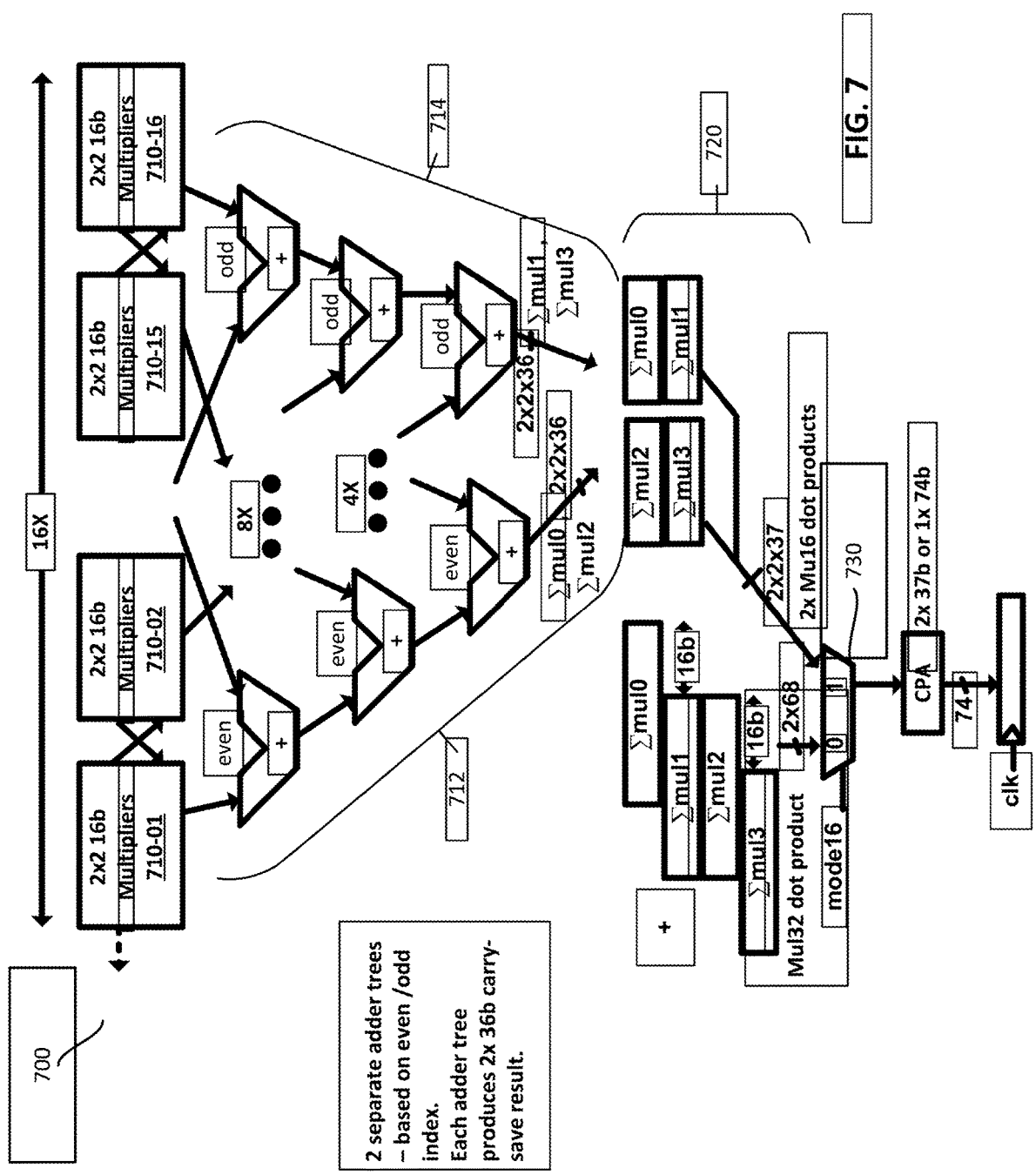
FIG. 7 illustrates an optimized multiply-adder tree according to an embodiment of the present invention.

FIG. 7 shows an embodiment of a multiply-adder tree that improves upon conventional multiply-adder trees (e.g., 500). Like conventional designs, multiply adder tree 700 can be configured to operate in either 4×16-bit and 1×32-bit modes. In 16-bit mode, multiply adder tree 700 computes 2 separate 32-element 16-bit dot-products $(2 \times \Sigma_{32}\text{Mul}16)$, while in 32-bit mode, a single 16-element 32-bit dot-product $(1 \times \Sigma_{16}\text{Mul}32)$ is computed. Multiply adder tree 700 also includes 16 multiplier building blocks 710.

Figure 8:
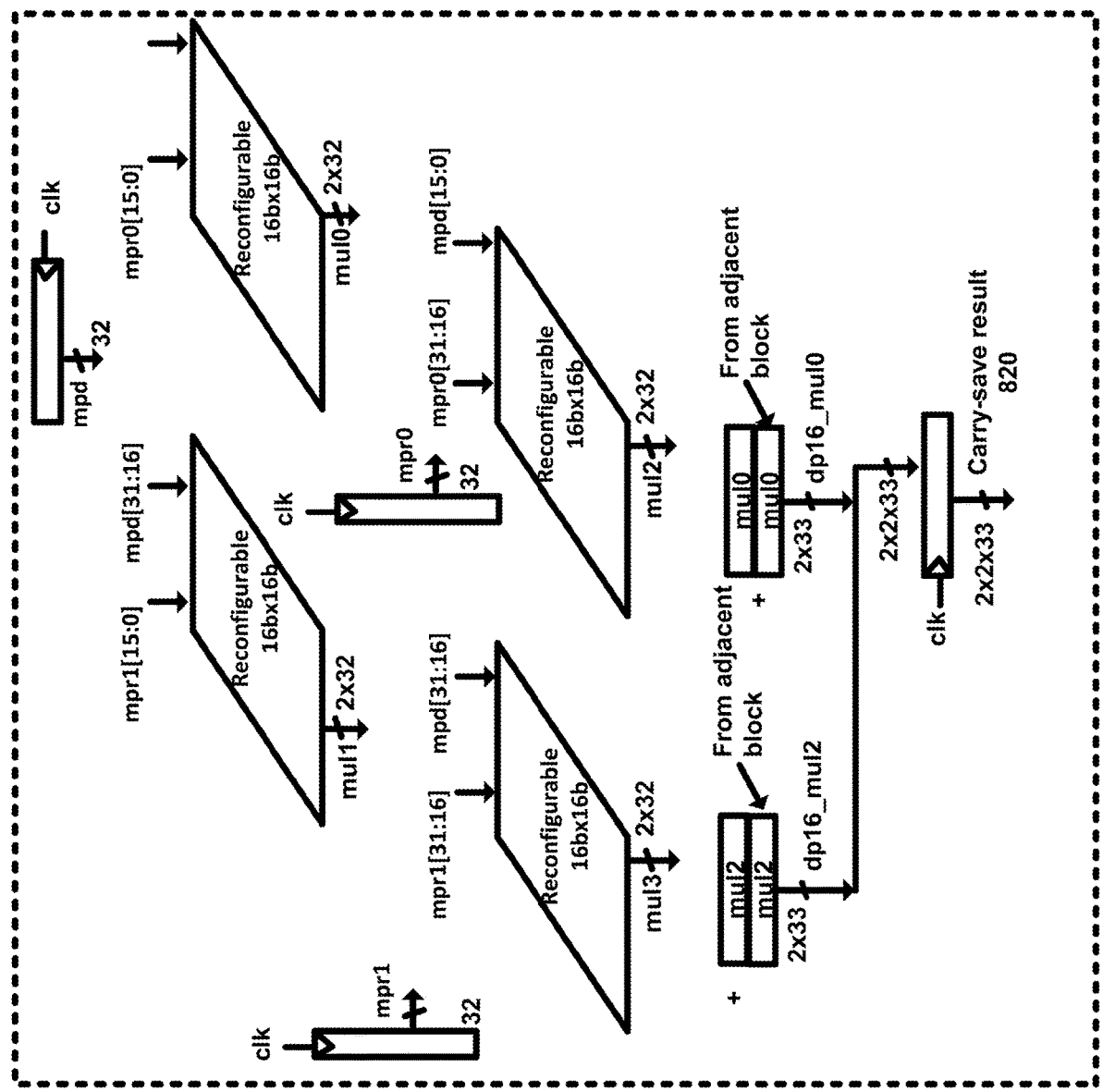
FIG. 8 illustrates an embodiment of a multiplier building block of the present invention.

The details of an embodiment of the multiplier building block 710 is illustrated in FIG. 8. As shown, multiplier building blocks 710 consists of a 2×2 arrangement of four 16-bit multipliers mul0-mul3. However, unlike convention designs, the 32-bit multiplier merge operation for the 32-bit mode has been removed from the multiplier building block 710. Moreover, instead of producing the 16-bit dot products for the 16-bit mode (dp16_1 and dp16_2), multiplier building block 710 produces the results of 16-bit multipliers (dp16_mul2 and dp16_mul0), which are intermediate values that are used to compute the final dot product results of either the 16-bit mode or the 32-bit mode. In some embodiments, the results of the 16-bit multipliers are merged and outputted as carry-save result 820.

According to an embodiment, the multiplier merge function from within each of the 16 multiplier building blocks 710-01~710-16 is moved to the end of the multiply adder tree 700. In one embodiment, the connections of multiply adder tree 700 are rearranged to produce the summations of corresponding multiplier quadrants across the different multiplier building blocks to produce $\Sigma_{16}\text{mul}0$, $\Sigma_{16}\text{mul}1$, $\Sigma_{16}\text{mul}2$, and $\Sigma_{16}\text{mul}3$. A single merge unit 720 at the end of the adder tree sums these partial results to produce the final dot-products. A single multiplexer 730, according to an embodiment, picks between the packed lower precision results and the single higher precision result based on the 16-bit mode or the 32-bit mode that is selected.

When compared with conventional multiply adder tree designs (e.g., 500), embodiments of multiply adder tree 700 have shown a reduction in total area required ranging from 11% to 21%. In terms of total energy required per cycle, embodiments of multiply adder tree 700 have achieved reductions of up to 19% in 4× 16-bit mode and up to 20% in 1× 32-bit mode.

An example of the present invention is a configurable integrated circuit that computes the vector dot product between a first N-bit vector and a second N-bit vector in a plurality of precision modes. The circuit includes M slices, each of which calculates the vector dot products between a corresponding segment of the first and the second N-bit vectors to output a plurality of intermediary multiplier results for a first precision mode. The circuit also includes a plurality of adder trees to sum up the plurality of intermediate multiplier results outputted by the M slices. Each of the adder trees produces a respective adder out result. The circuit further includes an accumulator to merge the adder out result from a first adder tree with the adder out result from a second adder tree to produce a vector dot product of the first and the second N-bit vector for a second precision mode. The second precision mode being of higher precision than the first precision mode.

The plurality of precision modes may indicate a vector element bit size of the first and second N-bit vectors. In one example, N is 512 and M is 64. Each of the corresponding segments of the first and the second N-bit vectors is 8 bits in size. The precision modes include 1-bit, 2-bit, 4-bit, and 8-bit precision modes. Each of the M slices may include eight exclusive NOR (XNOR) gates to calculate the intermediary results for the 1-bit precision mode, four 2-bit multipliers to calculate the intermediate results for the 2-bit precision mode, and two 4-bit multipliers to calculate the intermediary results for the 4-bit precision mode. The first plurality of intermediate multiplier results to be inputted into the first adder tree may include sixty-four 8-bit intermediary results and the second plurality of intermediate multiplier results to be inputted into the second adder tree may also include six-four 8-bit intermediary results. The first adder tree may produce a 14-bit adder out result and the second adder tree may produce an 18-bit adder out result. The first and the second adder tree may each include 6 levels of adders.

Another example of the present invention is a configurable integrated circuit that computes the vector dot product between a first N-bit vector and a second N-bit vector in a plurality of precision modes. The circuit includes M slices, each of which is to calculate a plurality of intermediary multiplier results between corresponding segments of the first and the second N-bit vectors. Each of the plurality of intermediary multiplier results corresponds to a quadrant usable to build a larger multiplier result. The circuit also includes a plurality of adder trees to sum up the plurality of intermediate multiplier results from the M slices based on the corresponding quadrants of each intermediary multiplier result to generate a plurality of multiplier sums. The circuitry further includes a multiply merge circuitry to merge the multiplier sums from all of the plurality of adder trees, including bit-shifting at least some of the multiplier sums, to produce a vector dot product of the first and the second N-bit vector in the highest precision mode.

The plurality of precision modes may indicate a vector element bit size of the first and second N-bit vectors. In one example, N may be 512, M may be 64, and each corresponding segment of the first and the second N-bit vectors may be 8 bits in size. The plurality of precision modes may include 1-bit, 2-bit, 4-bit, and 8-bit precision modes, with the 8-bit precision mode being the highest precision mode. Each of the M slices may include eight exclusive NOR (XNOR) gates to calculate the intermediary multiplier results for the 1-bit precision mode. Each of the M slices may further include two sets of 2-bit multipliers to calculate the intermediary multiplier results for the 2-bit precision mode, the 4-bit precision mode, and the 8-bit precision mode. Each set of the 2-bit multipliers may include four 2-bit multipliers and each of the 2-bit multiplier may correspond to a quadrant to build a larger 4-bit multiplier. The plurality of adder trees may include a first group of four adder trees. Each of the adder trees in the first group may produce a respective 10-bit multiplier sum. The plurality of adder trees may further also include a second group of two adder trees. Each of the adder trees in the second group may produce a respective 11-bit multiplier sum. The multiply merge circuitry of the integrated circuit may merge the four 10-bit multiplier sums and the two 11-bit multiplier sums to produce two 18-bit adder out results. The accumulator of the integrated circuit may the merge the two 18-bit adder out results to produce a vector dot product of the first and the second N-bit vector in the highest precision mode.

Figure 9:
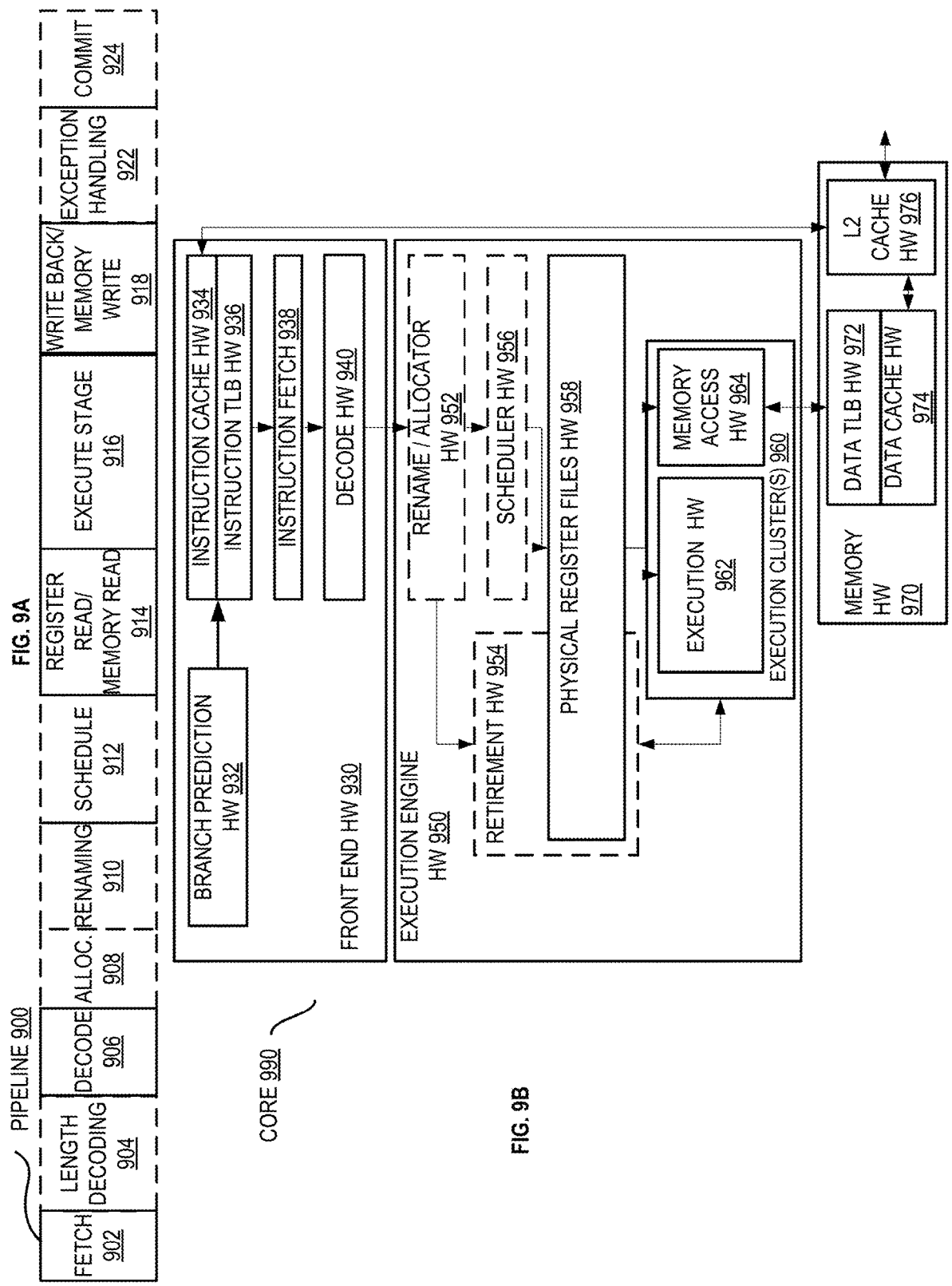
FIG. 9A is a block diagram illustrating both an exemplary in-order pipeline and an exemplary register renaming, out-of-order issue/execution pipeline according to embodiments of the invention.
FIG. 9B is a block diagram illustrating both an exemplary embodiment of an in-order architecture core and an exemplary register renaming, out-of-order issue/execution architecture core to be included in a processor according to embodiments of the invention.

FIG. 9A is a block diagram illustrating both an exemplary in-order pipeline and an exemplary register renaming, out-of-order issue/execution pipeline according to embodiments of the invention. FIG. 9B is a block diagram illustrating both an exemplary embodiment of an in-order architecture core and an exemplary register renaming, out-of-order issue/execution architecture core to be included in a processor according to embodiments of the invention. The solid lined boxes in FIGS. 9A-B illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 9A, a processor pipeline 900 includes a fetch stage 902, a length decode stage 904, a decode stage 906, an allocation stage 908, a renaming stage 910, a scheduling (also known as a dispatch or issue) stage 912, a register read/memory read stage 914, an execute stage 916, a write back/memory write stage 918, an exception handling stage 922, and a commit stage 924.

FIG. 9B shows processor core 990 including a front end hardware 930 coupled to an execution engine hardware 950, and both are coupled to a memory hardware 970. The core 990 may be a reduced instruction set computing (RISC) core, a complex instruction set computing (CISC) core, a very long instruction word (VLIW) core, or a hybrid or alternative core type. As yet another option, the core 990 may be a special-purpose core, such as, for example, a network or communication core, compression engine, coprocessor core, general purpose computing graphics processing unit (GPGPU) core, graphics core, or the like.

The front end hardware 930 includes a branch prediction hardware 932 coupled to an instruction cache hardware 934, which is coupled to an instruction translation lookaside buffer (TLB) 936, which is coupled to an instruction fetch hardware 938, which is coupled to a decode hardware 940. The decode hardware 940 (or decoder) may decode instructions, and generate as an output one or more micro-operations, micro-code entry points, microinstructions, other instructions, or other control signals, which are decoded from, or which otherwise reflect, or are derived from, the original instructions. The decode hardware 940 may be implemented using various different mechanisms. Examples of suitable mechanisms include, but are not limited to, look-up tables, hardware implementations, programmable logic arrays (PLAs), microcode read only memories (ROMs), etc. In one embodiment, the core 990 includes a microcode ROM or other medium that stores microcode for certain macroinstructions (e.g., in decode hardware 940 or otherwise within the front end hardware 930). The decode hardware 940 is coupled to a rename/allocator hardware 952 in the execution engine hardware 950.

The execution engine hardware 950 includes the rename/allocator hardware 952 coupled to a retirement hardware 954 and a set of one or more scheduler hardware 956. The scheduler hardware 956 represents any number of different schedulers, including reservations stations, central instruction window, etc. The scheduler hardware 956 is coupled to the physical register file(s) hardware 958. Each of the physical register file(s) hardware 958 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In one embodiment, the physical register file(s) hardware 958 comprises a vector registers hardware, a write mask registers hardware, and a scalar registers hardware. This register hardware may provide architectural vector registers, vector mask registers, and general purpose registers. The physical register file(s) hardware 958 is overlapped by the retirement hardware 954 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement hardware 954 and the physical register file(s) hardware 958 are coupled to the execution cluster(s) 960. The execution cluster(s) 960 includes a set of one or more execution hardware 962 and a set of one or more memory access hardware 964. The execution hardware 962 may perform various operations (e.g., shifts, addition, subtraction, multiplication) and on various types of data (e.g., scalar floating point, packed integer, packed floating point, vector integer, vector floating point). While some embodiments may include a number of execution hardware dedicated to specific functions or sets of functions, other embodiments may include only one execution hardware or multiple execution hardware that all perform all functions. The scheduler hardware 956, physical register file(s) hardware 958, and execution cluster(s) 960 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler hardware, physical register file(s) hardware, and/or execution cluster—and in the case of a separate memory access pipeline, certain embodiments are implemented in which only the execution cluster of this pipeline has the memory access hardware 964). It should also be understood that where separate pipelines are used, one or more of these pipelines may be out-of-order issue/execution and the rest in-order.

The set of memory access hardware 964 is coupled to the memory hardware 970, which includes a data TLB hardware 972 coupled to a data cache hardware 974 coupled to a level 2 (L2) cache hardware 976. In one exemplary embodiment, the memory access hardware 964 may include a load hardware, a store address hardware, and a store data hardware, each of which is coupled to the data TLB hardware 972 in the memory hardware 970. The instruction cache hardware 934 is further coupled to a level 2 (L2) cache hardware 976 in the memory hardware 970. The L2 cache hardware 976 is coupled to one or more other levels of cache and eventually to a main memory.

By way of example, the exemplary register renaming, out-of-order issue/execution core architecture may implement the pipeline 900 as follows: 1) the instruction fetch 938 performs the fetch and length decoding stages 902 and 904; 2) the decode hardware 940 performs the decode stage 906; 3) the rename/allocator hardware 952 performs the allocation stage 908 and renaming stage 910; 4) the scheduler hardware 956 performs the schedule stage 912; 5) the physical register file(s) hardware 958 and the memory hardware 970 perform the register read/memory read stage 914; the execution cluster 960 perform the execute stage 916; 6) the memory hardware 970 and the physical register file(s) hardware 958 perform the write back/memory write stage 918; 7) various hardware may be involved in the exception handling stage 922; and 8) the retirement hardware 954 and the physical register file(s) hardware 958 perform the commit stage 924.

The core 990 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.), including the instruction(s) described herein. In one embodiment, the core 990 includes logic to support a packed data instruction set extension (e.g., AVX1, AVX2, and/or some form of the generic vector friendly instruction format (U=0 and/or U=1), described below), thereby allowing the operations used by many multimedia applications to be performed using packed data.

It should be understood that the core may support multi-threading (executing two or more parallel sets of operations or threads), and may do so in a variety of ways including time sliced multithreading, simultaneous multithreading (where a single physical core provides a logical core for each of the threads that physical core is simultaneously multi-threading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache hardware 934/974 and a shared L2 cache hardware 976, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Figure 10:
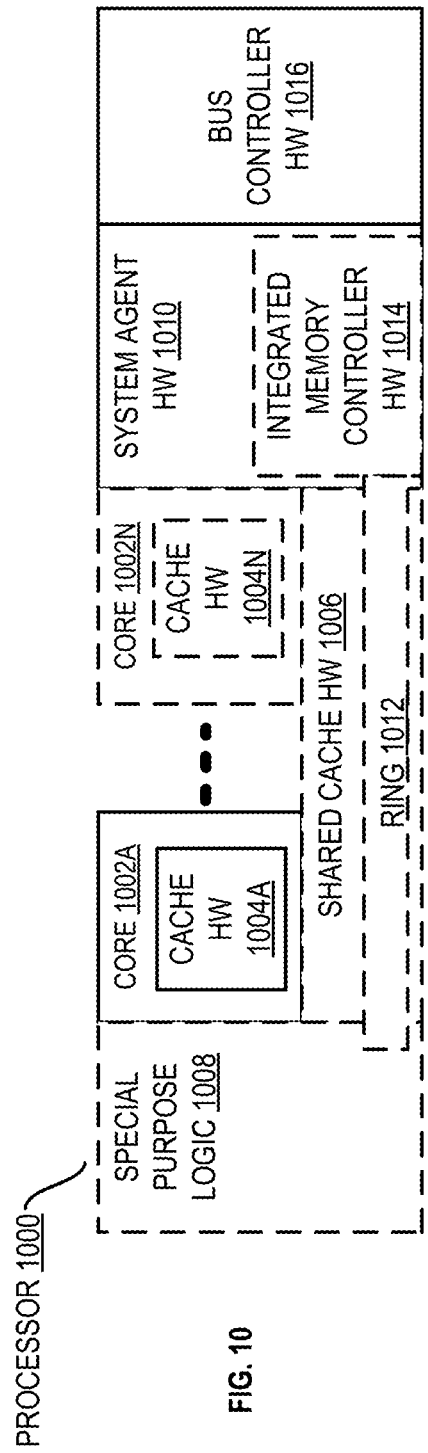
FIG. 10 is a block diagram of a single core processor and a multicore processor with integrated memory controller and graphics according to embodiments of the invention.

FIG. 10 is a block diagram of a processor 1000 that may have more than one core, may have an integrated memory controller, and may have integrated graphics according to embodiments of the invention. The solid lined boxes in FIG. 10 illustrate a processor 1000 with a single core 1002A, a system agent 1010, a set of one or more bus controller hardware 1016, while the optional addition of the dashed lined boxes illustrates an alternative processor 1000 with multiple cores 1002A-N, a set of one or more integrated memory controller hardware 1014 in the system agent hardware 1010, and special purpose logic 1008.

Thus, different implementations of the processor 1000 may include: 1) a CPU with the special purpose logic 1008 being integrated graphics and/or scientific (throughput) logic (which may include one or more cores), and the cores 1002A-N being one or more general purpose cores (e.g., general purpose in-order cores, general purpose out-of-order cores, a combination of the two); 2) a coprocessor with the cores 1002A-N being a large number of special purpose cores intended primarily for graphics and/or scientific (throughput); and 3) a coprocessor with the cores 1002A-N being a large number of general purpose in-order cores. Thus, the processor 1000 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), embedded processor, or the like. The processor may be implemented on one or more chips. The processor 1000 may be a part of and/or may be implemented on one or more substrates using any of a number of process technologies, such as, for example, BiCMOS, CMOS, or NMOS.

The memory hierarchy includes one or more levels of cache within the cores, a set or one or more shared cache hardware 1006, and external memory (not shown) coupled to the set of integrated memory controller hardware 1014. The set of shared cache hardware 1006 may include one or more mid-level caches, such as level 2 (L2), level 3 (L3), level 4 (L4), or other levels of cache, a last level cache (LLC), and/or combinations thereof. While in one embodiment a ring based interconnect hardware 1012 interconnects the integrated graphics logic 1008, the set of shared cache hardware 1006, and the system agent hardware 1010/integrated memory controller hardware 1014, alternative embodiments may use any number of well-known techniques for interconnecting such hardware. In one embodiment, coherency is maintained between one or more cache hardware 1006 and cores 1002-A-N.

In some embodiments, one or more of the cores 1002A-N are capable of multithreading. The system agent 1010 includes those components coordinating and operating cores 1002A-N. The system agent hardware 1010 may include for example a power control unit (PCU) and a display hardware. The PCU may be or include logic and components needed for regulating the power state of the cores 1002A-N and the integrated graphics logic 1008. The display hardware is for driving one or more externally connected displays.

The cores 1002A-N may be homogenous or heterogeneous in terms of architecture instruction set; that is, two or more of the cores 1002A-N may be capable of execution the same instruction set, while others may be capable of executing only a subset of that instruction set or a different instruction set. In one embodiment, the cores 1002A-N are heterogeneous and include both the "small" cores and "big" cores described below.

FIGS. 11-14 are block diagrams of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Figure 11:
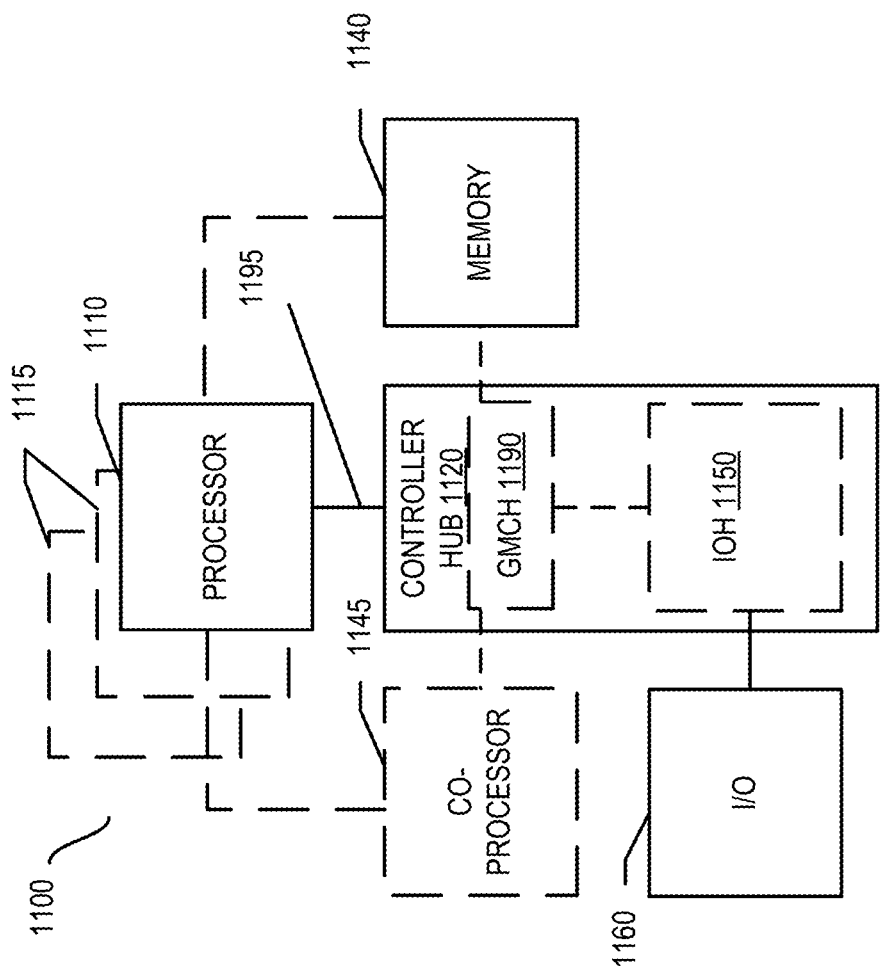
FIG. 11 illustrates a block diagram of a system in accordance with one embodiment of the present invention.

Referring now to FIG. 11, shown is a block diagram of a system 1100 in accordance with one embodiment of the present invention. The system 1100 may include one or more processors 1110, 1115, which are coupled to a controller hub 1120. In one embodiment the controller hub 1120 includes a graphics memory controller hub (GMCH) 1190 and an Input/Output Hub (IOH) 1150 (which may be on separate chips); the GMCH 1190 includes memory and graphics controllers to which are coupled memory 1140 and a coprocessor 1145; the IOH 1150 is couples input/output (I/O) devices 1160 to the GMCH 1190. Alternatively, one or both of the memory and graphics controllers are integrated within the processor (as described herein), the memory 1140 and the coprocessor 1145 are coupled directly to the processor 1110, and the controller hub 1120 in a single chip with the IOH 1150.

The optional nature of additional processors 1115 is denoted in FIG. 11 with broken lines. Each processor 1110, 1115 may include one or more of the processing cores described herein and may be some version of the processor 1000.

The memory 1140 may be, for example, dynamic random access memory (DRAM), phase change memory (PCM), or a combination of the two. For at least one embodiment, the controller hub 1120 communicates with the processor(s) 1110, 1115 via a multi-drop bus, such as a frontside bus (FSB), point-to-point interface, or similar connection 1195.

In one embodiment, the coprocessor 1145 is a special-purpose processor, such as, for example, a high-throughput MIC processor, a network or communication processor, compression engine, graphics processor, GPGPU, embedded processor, or the like. In one embodiment, controller hub 1120 may include an integrated graphics accelerator.

There can be a variety of differences between the physical resources 1110, 1115 in terms of a spectrum of metrics of merit including architectural, microarchitectural, thermal, power consumption characteristics, and the like.

In one embodiment, the processor 1110 executes instructions that control data processing operations of a general type. Embedded within the instructions may be coprocessor instructions. The processor 1110 recognizes these coprocessor instructions as being of a type that should be executed by the attached coprocessor 1145. Accordingly, the processor 1110 issues these coprocessor instructions (or control signals representing coprocessor instructions) on a coprocessor bus or other interconnect, to coprocessor 1145. Coprocessor(s) 1145 accept and execute the received coprocessor instructions.

Figure 12:
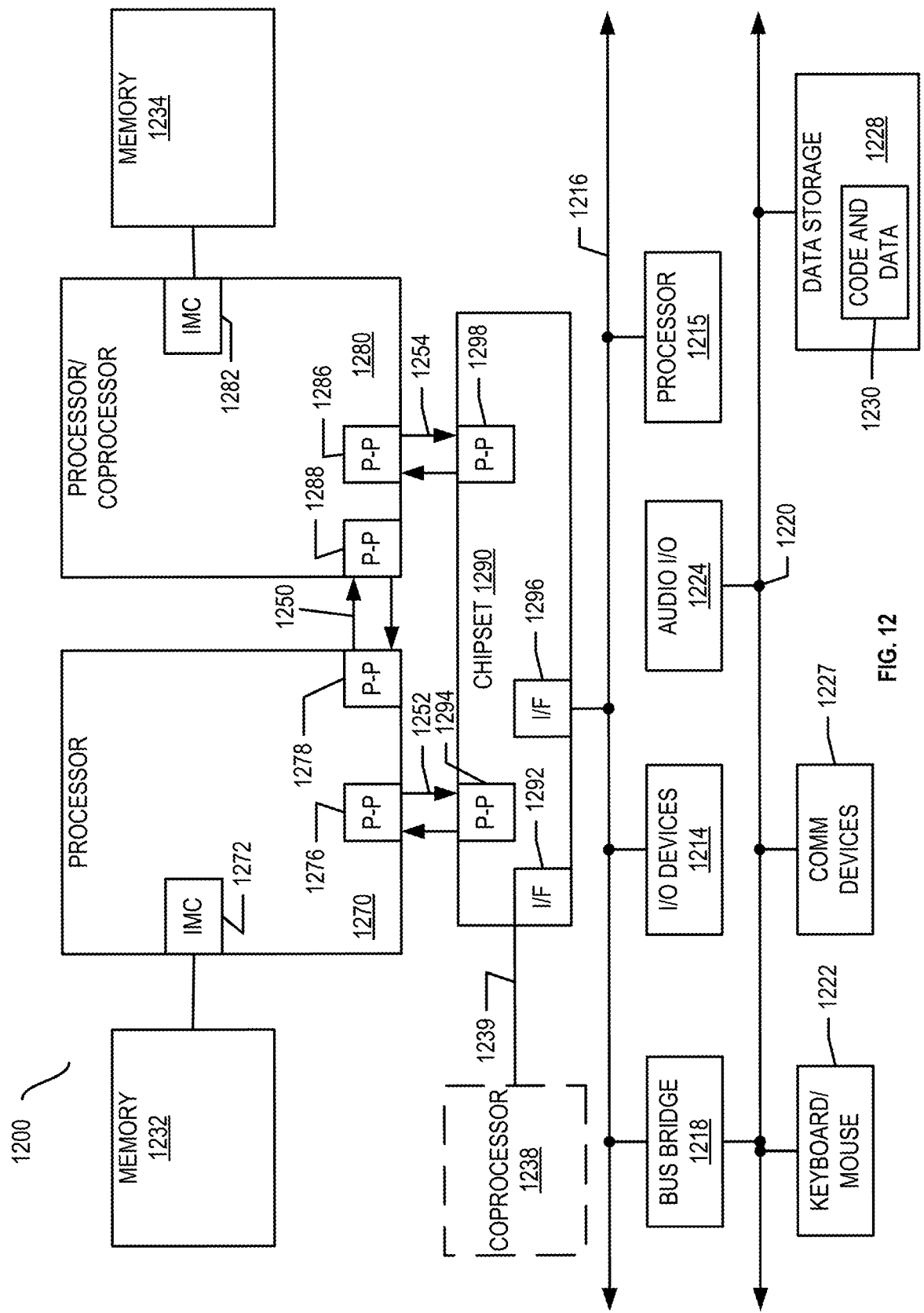
FIG. 12 illustrates a block diagram of a second system in accordance with an embodiment of the present invention.

Referring now to FIG. 12, shown is a block diagram of a first more specific exemplary system 1200 in accordance with an embodiment of the present invention. As shown in FIG. 12, multiprocessor system 1200 is a point-to-point interconnect system, and includes a first processor 1270 and a second processor 1280 coupled via a point-to-point interconnect 1250. Each of processors 1270 and 1280 may be some version of the processor 1000. In one embodiment of the invention, processors 1270 and 1280 are respectively processors 1110 and 1115, while coprocessor 1238 is coprocessor 1145. In another embodiment, processors 1270 and 1280 are respectively processor 1110 coprocessor 1145.

Processors 1270 and 1280 are shown including integrated memory controller (IMC) hardware 1272 and 1282, respectively. Processor 1270 also includes as part of its bus controller hardware point-to-point (P-P) interfaces 1276 and 1278; similarly, second processor 1280 includes P-P interfaces 1286 and 1288. Processors 1270, 1280 may exchange information via a point-to-point (P-P) interface 1250 using P-P interface circuits 1278, 1288. As shown in FIG. 12, IMCs 1272 and 1282 couple the processors to respective memories, namely a memory 1232 and a memory 1234, which may be portions of main memory locally attached to the respective processors.

Processors 1270, 1280 may each exchange information with a chipset 1290 via individual P-P interfaces 1252, 1254 using point to point interface circuits 1276, 1294, 1286, 1298. Chipset 1290 may optionally exchange information with the coprocessor 1238 via a high-performance interface 1239. In one embodiment, the coprocessor 1238 is a special-purpose processor, such as, for example, a high-throughput MIC processor, a network or communication processor, compression engine, graphics processor, GPGPU, embedded processor, or the like.

A shared cache (not shown) may be included in either processor or outside of both processors, yet connected with the processors via P-P interconnect, such that either or both processors' local cache information may be stored in the shared cache if a processor is placed into a low power mode.

Chipset 1290 may be coupled to a first bus 1216 via an interface 1296. In one embodiment, first bus 1216 may be a Peripheral Component Interconnect (PCI) bus, or a bus such as a PCI Express bus or another third generation I/O interconnect bus, although the scope of the present invention is not so limited.

As shown in FIG. 12, various I/O devices 1214 may be coupled to first bus 1216, along with a bus bridge 1218 which couples first bus 1216 to a second bus 1220. In one embodiment, one or more additional processor(s) 1215, such as coprocessors, high-throughput MIC processors, GPGPU's, accelerators (such as, e.g., graphics accelerators or digital signal processing (DSP) hardware), field programmable gate arrays, or any other processor, are coupled to first bus 1216. In one embodiment, second bus 1220 may be a low pin count (LPC) bus. Various devices may be coupled to a second bus 1220 including, for example, a keyboard and/or mouse 1222, communication devices 1227 and a storage hardware 1228 such as a disk drive or other mass storage device which may include instructions/code and data 1230, in one embodiment. Further, an audio I/O 1224 may be coupled to the second bus 1220. Note that other architectures are possible. For example, instead of the point-to-point architecture of FIG. 12, a system may implement a multi-drop bus or other such architecture.

Figure 13:
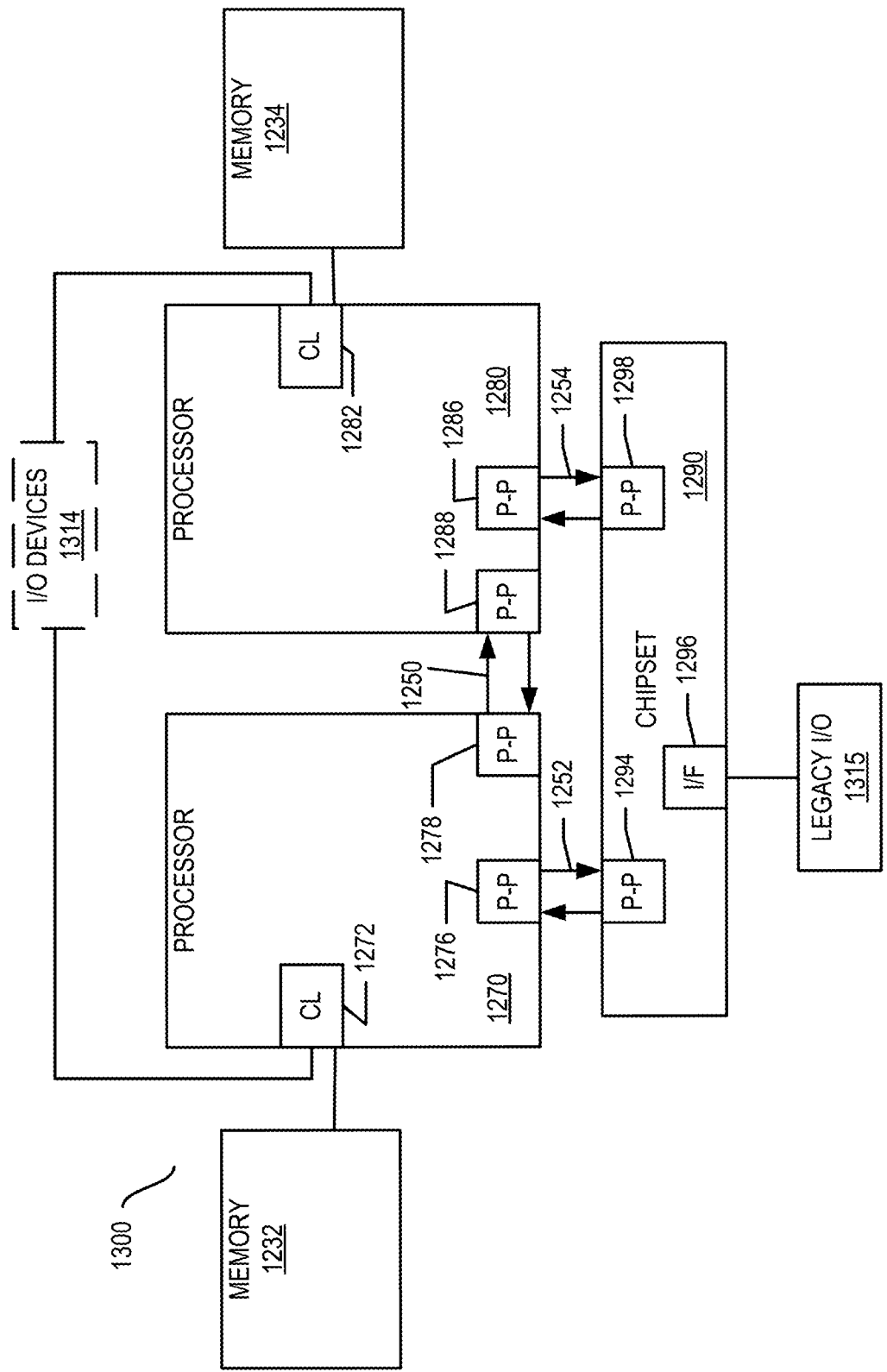
FIG. 13 illustrates a block diagram of a third system in accordance with an embodiment of the present invention.

Referring now to FIG. 13, shown is a block diagram of a second more specific exemplary system 1300 in accordance with an embodiment of the present invention. Like elements in FIGS. 12 and 13 bear like reference numerals, and certain aspects of FIG. 12 have been omitted from FIG. 13 in order to avoid obscuring other aspects of FIG. 13.

FIG. 13 illustrates that the processors 1270, 1280 may include integrated memory and I/O control logic ("CL") 1272 and 1282, respectively. Thus, the CL 1272, 1282 include integrated memory controller hardware and include I/O control logic. FIG. 13 illustrates that not only are the memories 1232, 1234 coupled to the CL 1272, 1282, but also that I/O devices 1314 are also coupled to the control logic 1272, 1282. Legacy I/O devices 1315 are coupled to the chipset 1290.

Figure 14:
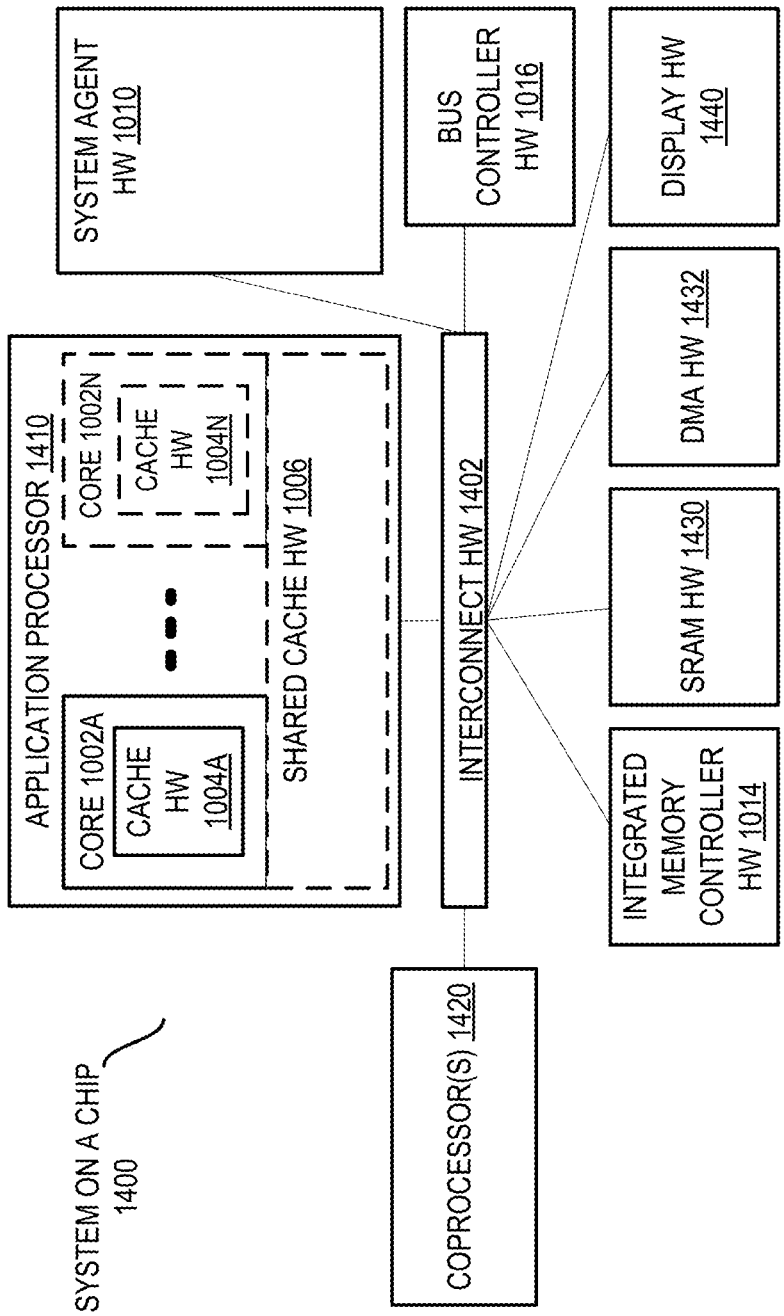
FIG. 14 illustrates a block diagram of a system on a chip (SoC) in accordance with an embodiment of the present invention.

Referring now to FIG. 14, shown is a block diagram of a SoC 1400 in accordance with an embodiment of the present invention. Similar elements in FIG. 10 bear like reference numerals. Also, dashed lined boxes are optional features on more advanced SoCs. In FIG. 14, an interconnect hardware 1402 is coupled to: an application processor 1410 which includes a set of one or more cores 1002A-N and shared cache hardware 1006; a system agent hardware 1010; a bus controller hardware 1016; an integrated memory controller hardware 1014; a set or one or more coprocessors 1420 which may include integrated graphics logic, an image processor, an audio processor, and a video processor; an static random access memory (SRAM) hardware 1430; a direct memory access (DMA) hardware 1432; and a display hardware 1440 for coupling to one or more external displays. In one embodiment, the coprocessor(s) 1420 include a special-purpose processor, such as, for example, a network or communication processor, compression engine, GPGPU, a high-throughput MIC processor, embedded processor, or the like.

Embodiments of the mechanisms disclosed herein may be implemented in hardware, software, firmware, or a combination of such implementation approaches. Embodiments of the invention may be implemented as computer programs or program code executing on programmable systems comprising at least one processor, a storage system (including volatile and non-volatile memory and/or storage elements), at least one input device, and at least one output device.

Program code, such as code 1230 illustrated in FIG. 12, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritable's (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of the invention also include non-transitory, tangible machine-readable media containing instructions or containing design data, such as Hardware Description Language (HDL), which defines structures, circuits, apparatuses, processors and/or system features described herein. Such embodiments may also be referred to as program products.

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

Figure 15:
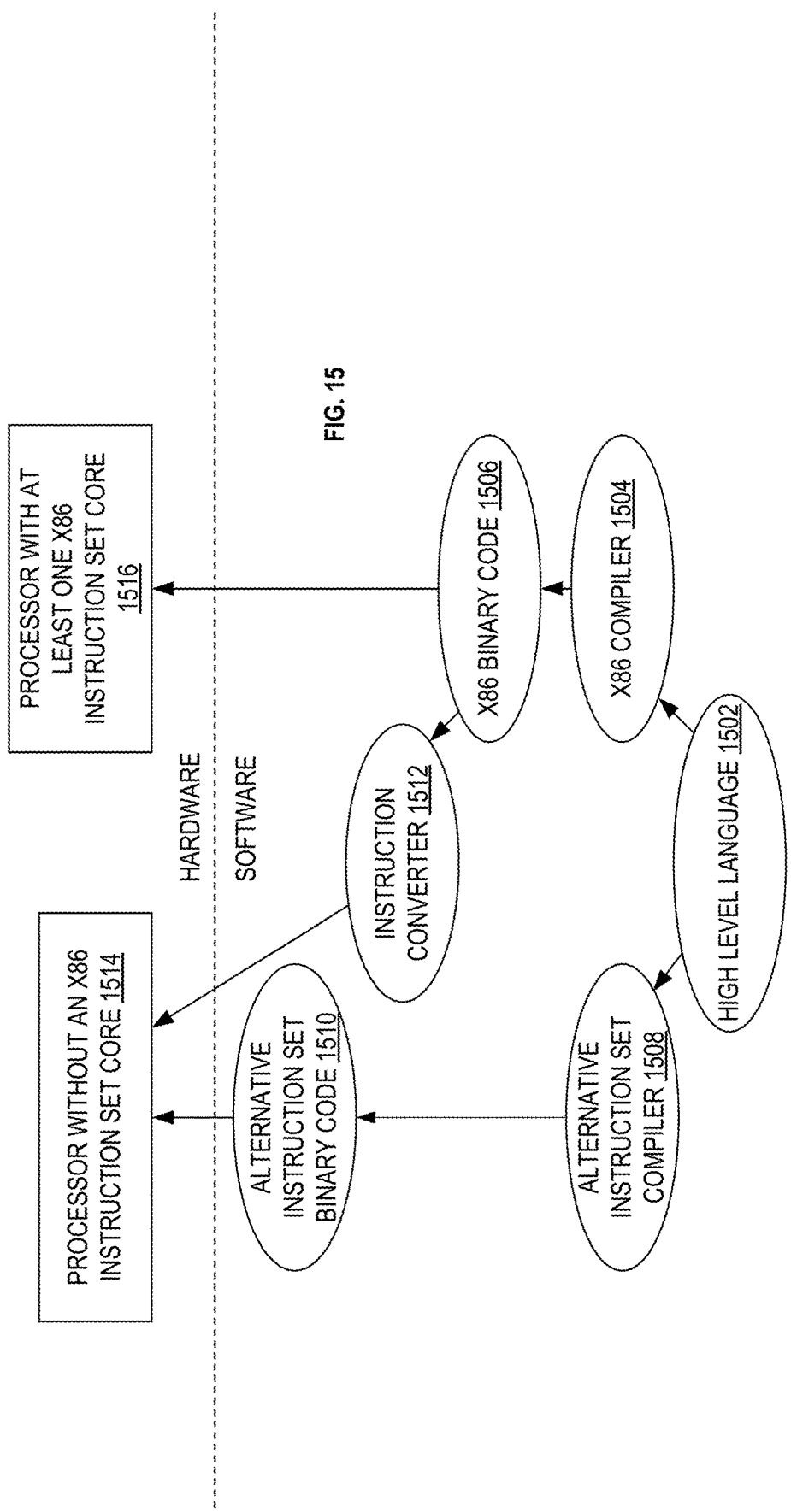
FIG. 15 illustrates a block diagram contrasting the use of a software instruction converter to convert binary instructions in a source instruction set to binary instructions in a target instruction set according to embodiments of the invention.

FIG. 15 is a block diagram contrasting the use of a software instruction converter to convert binary instructions in a source instruction set to binary instructions in a target instruction set according to embodiments of the invention. In the illustrated embodiment, the instruction converter is a software instruction converter, although alternatively the instruction converter may be implemented in software, firmware, hardware, or various combinations thereof. FIG. 15 shows a program in a high level language 1502 may be compiled using an x86 compiler 1504 to generate x86 binary code 1506 that may be natively executed by a processor with at least one x86 instruction set core 1516. The processor with at least one x86 instruction set core 1516 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 1504 represents a compiler that is operable to generate x86 binary code 1506 (e.g., object code) that can, with or without additional linkage processing, be executed on the processor with at least one x86 instruction set core 1516. Similarly, FIG. 15 shows the program in the high level language 1502 may be compiled using an alternative instruction set compiler 1508 to generate alternative instruction set binary code 1510 that may be natively executed by a processor without at least one x86 instruction set core 1514 (e.g., a processor with cores that execute the MIPS instruction set of MIPS Technologies of Sunnyvale, Calif. and/or that execute the ARM instruction set of ARM Holdings of Sunnyvale, Calif.). The instruction converter 1512 is used to convert the x86 binary code 1506 into code that may be natively executed by the processor without an x86 instruction set core 1514. This converted code is not likely to be the same as the alternative instruction set binary code 1510 because an instruction converter capable of this is difficult to make; however, the converted code will accomplish the general operation and be made up of instructions from the alternative instruction set. Thus, the instruction converter 1512 represents software, firmware, hardware, or a combination thereof that, through emulation, simulation or any other process, allows a processor or other electronic device that does not have an x86 instruction set processor or core to execute the x86 binary code 1506.

Although some embodiments have been described in reference to particular implementations, other implementations are possible according to some embodiments. Additionally, the arrangement and/or order of elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

In the description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

An embodiment is an implementation or example of the inventions. Reference in the specification to "an embodiment," "one embodiment," "some embodiments," or "other embodiments" means that a particular feature, structure, or characteristic described in connection with the embodiments is included in at least some embodiments, but not necessarily all embodiments, of the inventions. The various appearances "an embodiment," "one embodiment," or "some embodiments" are not necessarily all referring to the same embodiments.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the drawings. Rather, the scope of the invention is to be determined entirely by the following claims, which are to be construed in accordance with established doctrines of claim interpretation.

What is claimed is:

1. A configurable integrated circuit to compute vector dot products between a first N-bit vector and a second N-bit vector in a plurality of precision modes, the circuit comprising:
   M slices, each slice to calculate the vector dot products between a corresponding segment of the first and the second N-bit vectors, each slice to output a plurality of intermediary multiplier results for a first precision mode, wherein N and M are integer values greater than 1;
   a plurality of adder trees to sum up the plurality of intermediate multiplier results from the M slices, each of the plurality of adder trees to produce a respective adder out result; and
   an accumulator to merge the adder out result from a first adder tree with the adder out result from a second adder tree to produce a vector dot product of the first and the second N-bit vector for a second precision mode, wherein the second precision mode is of higher precision than the first precision mode.

2. The integrated circuit of claim 1, wherein the plurality of precision modes indicates a vector element bit size of the first and second N-bit vectors.

3. The integrated circuit of claim 1, wherein N is 512 and M is 64.

4. The integrated circuit of claim 3, wherein each corresponding segment of the first and the second N-bit vectors is 8 bits in size.

5. The integrated circuit of claim 4, wherein the plurality of precision modes includes 1-bit, 2-bit, 4-bit, and 8-bit precision modes.

6. The integrated circuit of claim 5, wherein each of the M slices comprises eight exclusive NOR (XNOR) gates to calculate the intermediary results for the 1-bit precision mode, four 2-bit multipliers to calculate the intermediary results for the 2-bit precision mode, and two 4-bit multipliers to calculate the intermediary results for the 4-bit precision mode.

7. The integrated circuit of claim 6, wherein a first plurality of intermediate multiplier results to be inputted into the first adder tree comprises sixty-four 8-bit intermediary results and a second plurality of intermediate multiplier results to be inputted into the second adder tree comprises six-four 8-bit intermediary results.

8. The integrated circuit of claim 7, wherein the first adder tree is to produce a 14-bit adder out result and the second adder tree is to produce an 18-bit adder out result.

9. The integrated circuit of claim 8, wherein the first and the second adder tree each comprises 6 levels of adders.

10. A configurable integrated circuit to compute vector dot products between a first N-bit vector and a second N-bit vector in a plurality of precision modes, the circuit comprising:
    M slices, each slice to calculate a plurality of intermediary multiplier results between a corresponding segment of the first and the second N-bit vectors in the plurality of precision modes, each of the plurality of intermediary multiplier results corresponding to a quadrant usable to build a larger multiplier result, wherein N and M are integer values greater than 1;
    a plurality of adder trees to sum up the plurality of intermediate multiplier results from the M slices based on the corresponding quadrants of each intermediary multiplier result to generate a plurality of multiplier sums; and
    a multiply merge circuitry to merge the multiplier sums from all of the plurality of adder trees, including bit-shifting at least some of the multiplier sums, to produce a vector dot product of the first and the second N-bit vector in a highest precision mode of the plurality of precision modes.

11. The integrated circuit of claim 10, wherein the plurality of precision modes is to indicate a vector element bit size of the first and second N-bit vectors.

12. The integrated circuit of claim 10, wherein N is 512 and M is 64.

13. The integrated circuit of claim 12, wherein each corresponding segment of the first and the second N-bit vectors is 8 bits in size.

14. The integrated circuit of claim 13, wherein the plurality of precision modes includes 1-bit, 2-bit, 4-bit, and 8-bit precision modes, the 8-bit precision mode being the highest precision mode.

15. The integrated circuit of claim 14, wherein each of the M slices comprises eight exclusive NOR (XNOR) gates to calculate the intermediary multiplier results for the 1-bit precision mode, each of the M slices further comprises two sets of 2-bit multipliers to calculate the intermediary multiplier results for the 2-bit precision mode, the 4-bit precision mode, and the 8-bit precision mode.

16. The integrated circuit of claim 15, wherein each set of the 2-bit multipliers comprises four 2-bit multipliers, each of the 2-bit multiplier corresponding to a quadrant to build a larger 4-bit multiplier.

17. The integrated circuit of claim 16, wherein the plurality of adder trees comprises a first group of four adder trees, each of the adder trees in the first group produces a respective 10-bit multiplier sum.

18. The integrated circuit of claim 17, wherein the plurality of adder trees further comprises a second group of two adder trees, each of the adder trees in the second group produces a respective 11-bit multiplier sum.

19. The integrated circuit of claim 18, wherein the multiply merge circuitry is to merge the four 10-bit multiplier sums and the two 11-bit multiplier sums, to produce two 18-bit adder out results.

20. The integrated circuit of claim 19, further comprising an accumulator to merge the two 18-bit adder out results to produce a vector dot product of the first and the second N-bit vector in the highest precision mode.

* * * * *